(12) United States Patent
Alden et al.

(10) Patent No.: US 9,899,123 B2
(45) Date of Patent: Feb. 20, 2018

(54) NANOWIRES-BASED TRANSPARENT CONDUCTORS

(76) Inventors: Jonathan S. Alden, Mountain View, CA (US); Haixia Dai, Mountain View, CA (US); Michael R. Knapp, Emerald Hills, CA (US); Shuo Na, San Jose, CA (US); Hash Pakbaz, Hayward, CA (US); Florian Pschenitzka, San Francisco, CA (US); Xina Quan, Saratoga, CA (US); Michael A. Spaid, Mountain View, CA (US); Adrian Winoto, San Francisco, CA (US); Jeffrey Wolk, Half Moon Bay, CA (US)

( * ) Notice: Subject to any disclaimer, the term of this patent is extended or adjusted under 35 U.S.C. 154(b) by 0 days.

(21) Appl. No.: 12/098,329

(22) Filed: Apr. 4, 2008

(65) Prior Publication Data

US 2008/0286447 A1 Nov. 20, 2008

Related U.S. Application Data

(62) Division of application No. 11/504,822, filed on Aug. 14, 2006.

(Continued)

(51) Int. Cl.
*B05D 5/12* (2006.01)
*H01B 1/22* (2006.01)
(Continued)

(52) U.S. Cl.
CPC ............... *H01B 1/22* (2013.01); *B82Y 20/00* (2013.01); *B82Y 30/00* (2013.01); *C03C 17/007* (2013.01); *C03C 17/008* (2013.01); *C09D 11/52* (2013.01); *C23F 11/02* (2013.01); *C30B 7/02* (2013.01); *C30B 29/02* (2013.01); *C30B 29/60* (2013.01); *C30B 33/00* (2013.01); *G02F 1/13439* (2013.01); *H01L 31/022466* (2013.01); *B22F 2998/00* (2013.01); *C03C 2217/445* (2013.01); *C03C 2217/479* (2013.01); *H01L 27/14623* (2013.01); *H01L 31/02164* (2013.01);
(Continued)

(58) Field of Classification Search
CPC ................................ C23C 26/00; C23C 30/00
USPC ......................................................... 427/108
See application file for complete search history.

(56) References Cited

U.S. PATENT DOCUMENTS

| 707,675 A | 8/1902 | Colburn |
| 796,027 A | 8/1905 | Wittbold |

(Continued)

FOREIGN PATENT DOCUMENTS

| CN | 1441014 A | 9/2003 |
| EP | 0 100 670 A1 | 2/1984 |

(Continued)

OTHER PUBLICATIONS

Martin et al., Interactions Between Suspended Nanowires and Patterned Surfaces, Adv. Funct. Mater., 2002, p. 759-765.*

(Continued)

*Primary Examiner* — Tabatha Penny

(57) ABSTRACT

A method for forming a transparent conductor including a conductive layer coated on a substrate is described. The method comprises depositing a plurality of metal nanowires on a surface of a substrate, the metal nanowires being dispersed in a liquid; and forming a metal nanowire network layer on the substrate by allowing the liquid to dry.

39 Claims, 29 Drawing Sheets

Related U.S. Application Data

(60) Provisional application No. 60/707,675, filed on Aug. 12, 2005, provisional application No. 60/796,027, filed on Apr. 28, 2006, provisional application No. 60/798,878, filed on May 8, 2006.

(51) Int. Cl.

| | | |
|---|---|---|
| *B82Y 20/00* | (2011.01) | |
| *B82Y 30/00* | (2011.01) | |
| *C09D 11/52* | (2014.01) | |
| *C23F 11/02* | (2006.01) | |
| *C30B 7/02* | (2006.01) | |
| *C30B 29/02* | (2006.01) | |
| *C30B 29/60* | (2006.01) | |
| *C30B 33/00* | (2006.01) | |
| *G02F 1/1343* | (2006.01) | |
| *H01L 31/0224* | (2006.01) | |
| *C03C 17/00* | (2006.01) | |
| *H01L 27/146* | (2006.01) | |
| *H01L 31/0216* | (2014.01) | |
| *H05K 1/02* | (2006.01) | |
| *H05K 1/09* | (2006.01) | |
| *H05K 3/04* | (2006.01) | |

(52) U.S. Cl.
CPC ........... *H01L 2224/45139* (2013.01); *H01L 2224/49175* (2013.01); *H01L 2924/00011* (2013.01); *H01L 2924/12044* (2013.01); *H01L 2924/3011* (2013.01); *H05K 1/0269* (2013.01); *H05K 1/097* (2013.01); *H05K 3/048* (2013.01); *H05K 2201/0145* (2013.01); *H05K 2201/0154* (2013.01); *H05K 2201/026* (2013.01); *H05K 2201/10128* (2013.01); *H05K 2203/1545* (2013.01); *Y10S 977/762* (2013.01)

(56) References Cited

U.S. PATENT DOCUMENTS

| | | | |
|---|---|---|---|
| 798,027 A | 8/1905 | Ernst | |
| 2,426,318 A | 8/1947 | Menaul | 252/8.55 |
| 3,167,429 A | 1/1965 | Levy | 96/61 |
| 3,552,969 A | 1/1971 | Henn et al. | 96/66 |
| 4,486,350 A | 12/1984 | Bauer et al. | 260/245.86 |
| 4,539,041 A | 9/1985 | Figlarz et al. | 75/0.5 A |
| 4,904,571 A * | 2/1990 | Miyashita | G03F 7/425 134/2 |
| 5,009,812 A | 4/1991 | Finter et al. | 252/500 |
| 5,063,125 A | 11/1991 | Yuh et al. | 430/59 |
| 5,165,985 A | 11/1992 | Wiste et al. | 428/209 |
| 5,225,244 A | 7/1993 | Aharoni et al. | 427/240 |
| 5,258,140 A | 11/1993 | Chetcuti | 252/519 |
| 5,294,401 A | 3/1994 | Hagiwara | 422/48 |
| 5,436,353 A | 7/1995 | Chetcuti | 549/15 |
| 5,518,810 A | 5/1996 | Nishihara et al. | 428/328 |
| 5,554,446 A | 9/1996 | Minder et al. | 428/411.1 |
| 5,565,143 A | 10/1996 | Chan | 252/514 |
| 5,716,663 A | 2/1998 | Capote et al. | 427/96 |
| 5,719,016 A | 2/1998 | Christian et al. | 430/530 |
| 5,731,119 A | 3/1998 | Eichorst et al. | 430/63 |
| 5,750,054 A | 5/1998 | Cinquina et al. | 252/500 |
| 5,759,230 A | 6/1998 | Chow et al. | 75/362 |
| 5,788,738 A | 8/1998 | Pirzada et al. | 75/331 |
| 5,851,507 A | 12/1998 | Pirzada et al. | 423/659 |
| 5,867,945 A | 2/1999 | Scafidi | 52/16 |
| 5,874,684 A | 2/1999 | Parker et al. | 75/228 |
| 5,897,945 A | 4/1999 | Lieber et al. | 428/323 |
| 5,905,000 A | 5/1999 | Yadav et al. | 429/33 |
| 5,908,585 A | 6/1999 | Shibuta | |
| 5,951,918 A | 9/1999 | Kuwajima et al. | |
| 5,952,040 A | 9/1999 | Yadav et al. | 427/126.3 |
| 6,045,925 A | 4/2000 | Klabunde et al. | 428/548 |
| 6,241,451 B1 | 6/2001 | Albright et al. | 414/501 |
| 6,250,984 B1 * | 6/2001 | Jin et al. | 445/51 |
| 6,265,466 B1 | 7/2001 | Glatkowski et al. | 523/137 |
| 6,274,412 B1 | 8/2001 | Kydd et al. | 438/149 |
| 6,294,401 B1 | 9/2001 | Jacobson et al. | 438/99 |
| 6,379,745 B1 | 4/2002 | Kydd et al. | 427/96 |
| 6,416,818 B1 | 7/2002 | Aikens et al. | 427/383.1 |
| 6,444,495 B1 | 9/2002 | Leung et al. | 438/118 |
| 6,524,709 B1 * | 2/2003 | Sagara et al. | 428/413 |
| 6,536,106 B1 | 3/2003 | Jackson et al. | 29/872 |
| 6,541,539 B1 | 4/2003 | Yang et al. | 523/200 |
| 6,597,947 B1 | 7/2003 | Inoue et al. | 604/20 |
| 6,632,274 B2 | 10/2003 | Kawamoto et al. | 106/286.4 |
| 6,641,775 B2 | 11/2003 | Vigliotti et al. | 264/618 |
| 6,673,142 B2 | 1/2004 | Tofuku et al. | 106/287.16 |
| 6,686,249 B1 | 2/2004 | Yukinobu et al. | 438/328 |
| 6,706,402 B2 | 3/2004 | Rueckes et al. | 428/408 |
| 6,713,176 B2 | 3/2004 | Yadav et al. | 428/402 |
| 6,741,019 B1 | 5/2004 | Filas et al. | |
| 6,773,823 B2 | 8/2004 | O'Connor et al. | 428/548 |
| 6,781,116 B2 | 8/2004 | Bateman | 250/281 |
| 6,781,166 B2 | 8/2004 | Lieber et al. | 257/211 |
| 6,783,569 B2 | 8/2004 | Cheon et al. | 75/348 |
| 6,813,931 B2 | 11/2004 | Yadav et al. | 73/31.05 |
| 6,835,591 B2 | 12/2004 | Rueckes et al. | 438/99 |
| 6,849,109 B2 | 2/2005 | Yadav et al. | 106/31.13 |
| 6,855,202 B2 | 2/2005 | Alivisatos et al. | 117/68 |
| 6,872,645 B2 | 3/2005 | Duan et al. | 438/584 |
| 6,881,604 B2 | 4/2005 | Lindstrom et al. | 438/99 |
| 6,882,051 B2 | 4/2005 | Majumdar et al. | 257/746 |
| 6,912,092 B2 | 6/2005 | Ukuda | 359/642 |
| 6,916,842 B2 | 7/2005 | Manzer | 514/424 |
| 6,916,872 B2 | 7/2005 | Yadav et al. | 524/430 |
| 6,933,331 B2 | 8/2005 | Yadav et al. | 523/210 |
| 6,936,761 B2 | 8/2005 | Pichler | 136/256 |
| 6,942,921 B2 | 9/2005 | Rueckes et al. | 428/408 |
| 6,946,410 B2 | 9/2005 | French et al. | 438/800 |
| 6,949,931 B2 | 9/2005 | Cole et al. | 324/464 |
| 6,975,067 B2 | 12/2005 | McCormick et al. | 313/512 |
| 6,982,206 B1 | 1/2006 | Berman et al. | 438/400 |
| 6,988,925 B2 | 1/2006 | Arthur et al. | |
| 7,018,872 B2 | 3/2006 | Hirai et al. | 438/149 |
| 7,029,514 B1 | 4/2006 | Yang et al. | 75/348 |
| 7,033,416 B2 | 4/2006 | Kurihara et al. | 75/351 |
| 7,048,806 B2 | 5/2006 | Ochomogo et al. | 134/34 |
| 7,052,940 B2 | 5/2006 | Lee | 438/149 |
| 7,060,241 B2 | 6/2006 | Glatkowski | 423/447.1 |
| 7,062,848 B2 | 6/2006 | Pan et al. | 29/825 |
| 7,064,372 B2 | 6/2006 | Duan et al. | 257/296 |
| 7,067,328 B2 | 6/2006 | Dubrow et al. | 438/1 |
| 7,091,120 B2 | 8/2006 | Buretea et al. | 438/602 |
| 7,135,055 B2 | 11/2006 | Mirkin et al. | 75/343 |
| 7,135,394 B2 | 11/2006 | Houng et al. | 438/610 |
| 7,135,728 B2 | 11/2006 | Duan et al. | 257/296 |
| 7,136,237 B2 | 11/2006 | Ogawa | 359/795 |
| 7,147,687 B2 | 12/2006 | Mirkin et al. | 75/343 |
| 7,190,049 B2 | 3/2007 | Tuominen et al. | 257/618 |
| 7,270,694 B2 | 9/2007 | Li et al. | 75/351 |
| 7,341,944 B2 | 3/2008 | Harutyunyan | 438/679 |
| 7,849,424 B2 | 12/2010 | Wolk et al. | 716/3 |
| 7,963,646 B2 | 6/2011 | Magdassi et al. | |
| 2002/0013160 A1 | 1/2002 | Harano | 455/556 |
| 2002/0022801 A1 | 2/2002 | DeLegge | 604/178 |
| 2002/0063242 A1 | 5/2002 | Hayashi et al. | 252/500 |
| 2003/0030760 A1 | 2/2003 | Nishiki | 349/43 |
| 2003/0072891 A1 | 4/2003 | Murakami et al. | 427/569 |
| 2003/0074492 A1 | 4/2003 | Cochran | 710/5 |
| 2003/0082412 A1 | 5/2003 | Fukuda et al. | 428/697 |
| 2003/0122111 A1 | 7/2003 | Glatkowski | |
| 2003/0180508 A1 * | 9/2003 | McArdle et al. | 428/195.1 |
| 2003/0185990 A1 | 10/2003 | Bittner et al. | 427/385.5 |
| 2003/0186522 A1 * | 10/2003 | Duan et al. | 438/584 |
| 2003/0211333 A1 | 11/2003 | Watanabe et al. | 428/422.8 |
| 2004/0016914 A1 | 1/2004 | Matsuda et al. | 252/500 |
| 2004/0036993 A1 | 2/2004 | Tin | |
| 2004/0038808 A1 | 2/2004 | Hampden-Smith et al. | 502/180 |
| 2004/0099438 A1 * | 5/2004 | Arthur et al. | 174/257 |
| 2004/0105980 A1 | 6/2004 | Sudarshan et al. | 428/404 |
| 2004/0147049 A1 | 7/2004 | Lee et al. | 438/20 |

(56) References Cited

U.S. PATENT DOCUMENTS

| | | | |
|---|---|---|---|
| 2004/0197546 A1 | 10/2004 | Rinzler et al. | |
| 2004/0219361 A1* | 11/2004 | Cui et al. | 428/402.2 |
| 2005/0003081 A1 | 1/2005 | Nakano et al. | 427/160 |
| 2005/0009714 A1 | 1/2005 | Chen et al. | 508/591 |
| 2005/0056118 A1 | 3/2005 | Xia et al. | 75/330 |
| 2005/0062019 A1 | 3/2005 | Yukinobu | |
| 2005/0064185 A1 | 3/2005 | Buretea et al. | 428/364 |
| 2005/0074589 A1 | 4/2005 | Pan et al. | 428/206 |
| 2005/0089679 A1 | 4/2005 | Ittel et al. | 428/323 |
| 2005/0165120 A1 | 7/2005 | Kumar et al. | 516/78 |
| 2005/0173680 A1 | 8/2005 | Yang | 252/500 |
| 2005/0204956 A1 | 9/2005 | Berkei et al. | 106/31.64 |
| 2005/0215689 A1 | 9/2005 | Garbar et al. | 524/440 |
| 2005/0222333 A1* | 10/2005 | Hsu | B82Y 10/00 525/178 |
| 2006/0068025 A1 | 3/2006 | Chang et al. | |
| 2006/0189113 A1 | 8/2006 | Vanheusden et al. | 438/597 |
| 2006/0215250 A1 | 9/2006 | Shibuya et al. | 359/270 |
| 2006/0257637 A1 | 11/2006 | Pereira et al. | |
| 2006/0257638 A1* | 11/2006 | Glatkowski et al. | 428/292.1 |
| 2007/0034052 A1 | 2/2007 | Vanheusden et al. | 75/362 |
| 2007/0065651 A1 | 3/2007 | Glatkowski et al. | 428/297.4 |
| 2007/0074316 A1 | 3/2007 | Alden et al. | 977/762 |
| 2007/0088114 A1 | 4/2007 | Asgari | |
| 2007/0092816 A1 | 4/2007 | Wu et al. | |
| 2007/0160647 A1 | 7/2007 | Pritchard et al. | 424/423 |
| 2007/0275320 A1 | 11/2007 | Washio et al. | 430/270.1 |
| 2008/0003130 A1 | 1/2008 | Xia et al. | 420/501 |
| 2008/0003363 A1 | 1/2008 | Park et al. | 427/256 |
| 2008/0135715 A1 | 6/2008 | Chen et al. | |
| 2008/0143906 A1 | 6/2008 | Allemand et al. | 349/43 |
| 2008/0210052 A1 | 9/2008 | Allemand et al. | 75/300 |
| 2008/0229612 A1 | 9/2008 | Sommer et al. | 36/44 |
| 2008/0259262 A1 | 10/2008 | Jones et al. | 349/139 |
| 2009/0052029 A1 | 2/2009 | Dai et al. | 359/486 |
| 2009/0223703 A1 | 9/2009 | Winoto | 174/257 |
| 2009/0228131 A1 | 9/2009 | Wolk et al. | 700/103 |
| 2009/0242231 A1 | 10/2009 | Miyagisima et al. | 174/68.1 |
| 2009/0283304 A1 | 11/2009 | Winoto | 174/257 |
| 2009/0321113 A1 | 12/2009 | Allemand et al. | 174/257 |
| 2010/0034693 A1 | 2/2010 | Li | 420/501 |
| 2010/0243295 A1 | 9/2010 | Allemand et al. | 174/250 |
| 2010/0307792 A1 | 12/2010 | Allemand et al. | 174/126.1 |
| 2011/0024159 A1 | 2/2011 | Allemand et al. | 174/126.1 |
| 2011/0042126 A1 | 2/2011 | Spaid et al. | 174/250 |
| 2011/0045272 A1 | 2/2011 | Allemand | 428/292.1 |
| 2011/0048170 A1 | 3/2011 | Bhatia et al. | 75/330 |
| 2011/0163403 A1 | 7/2011 | Bhatia et al. | 257/432 |

FOREIGN PATENT DOCUMENTS

| | | |
|---|---|---|
| EP | 0 234 347 A1 | 9/1987 |
| EP | 0 534 744 A1 | 3/1993 |
| EP | 0 653 763 A1 | 5/1995 |
| EP | 0 765 704 | 4/1997 |
| EP | 1 039 480 A1 | 9/2000 |
| EP | 1 046 945 A2 | 10/2000 |
| EP | 1 089 113 A2 | 4/2001 |
| EP | 1 138 729 | 10/2001 |
| EP | 1209694 A2 | 5/2002 |
| EP | 1 220 234 A1 | 7/2002 |
| EP | 1 455 562 A1 | 9/2004 |
| EP | 1 619 524 A1 | 1/2006 |
| EP | 1 623 954 | 2/2006 |
| EP | 1 769 867 | 4/2007 |
| EP | 1 922 759 | 5/2008 |
| EP | 1 369 933 A2 | 12/2008 |
| JP | 05194856 A | 8/1993 |
| JP | 06005115 A | 1/1994 |
| JP | 06162818 A | 6/1994 |
| JP | 06215631 A | 8/1994 |
| JP | 07094036 A | 4/1995 |
| JP | 09324324 A | 12/1997 |
| JP | 10017325 A | 1/1998 |
| JP | 10046382 A | 2/1998 |
| JP | 10226007 A | 8/1998 |
| JP | 2001093414 | 4/2001 |
| JP | 2001-155542 | 6/2001 |
| JP | 2001-166120 | 6/2001 |
| JP | 2001205600 A | 7/2001 |
| JP | 2001291431 A | 10/2001 |
| JP | 2002-347033 A | 12/2002 |
| JP | 2004-58049 | 2/2004 |
| JP | 2004035962 A | 2/2004 |
| JP | 2004055486 A | 2/2004 |
| JP | 2004111106 A | 4/2004 |
| JP | 2004-182812 | 7/2004 |
| JP | 2004-196912 A | 7/2004 |
| JP | 2004182546 A | 7/2004 |
| JP | 2004196923 A | 7/2004 |
| JP | 2004196981 A | 7/2004 |
| JP | 2004-238503 A | 8/2004 |
| JP | 2004230690 A | 8/2004 |
| JP | 2004253326 A | 9/2004 |
| JP | 2004253796 A | 9/2004 |
| JP | 2004256702 A | 9/2004 |
| JP | 2005-507452 A | 3/2005 |
| JP | 2005103723 A | 4/2005 |
| JP | 2005-126664 A | 5/2005 |
| JP | 2005-154654 A | 6/2005 |
| JP | 3665969 | 6/2005 |
| JP | 2005239481 A | 9/2005 |
| JP | 2005277405 A | 10/2005 |
| JP | 2005281357 A | 10/2005 |
| JP | 2005-536061 | 11/2005 |
| JP | 2005311330 A | 11/2005 |
| JP | 2005317394 A | 11/2005 |
| JP | 2005317395 A | 11/2005 |
| JP | 2005335054 A | 12/2005 |
| JP | 2006-19178 A | 1/2006 |
| JP | 2006035771 A | 2/2006 |
| JP | 2006035773 A | 2/2006 |
| JP | 2006049843 A | 2/2006 |
| JP | 2006075961 A | 3/2006 |
| JP | 2006103982 A | 4/2006 |
| JP | 2006103983 A | 4/2006 |
| JP | 2006111675 A | 4/2006 |
| JP | 2006133528 | 5/2006 |
| JP | 2006171336 A | 6/2006 |
| JP | 2006517485 T2 | 7/2006 |
| JP | 2006233252 | 9/2006 |
| JP | 2006239790 A | 9/2006 |
| JP | 2006272876 A | 10/2006 |
| JP | 2006310353 A | 11/2006 |
| JP | 3903159 | 4/2007 |
| JP | 2007091859 A | 4/2007 |
| JP | 2007098563 A | 4/2007 |
| JP | 2007105822 A | 4/2007 |
| JP | 2007112133 A | 5/2007 |
| KR | 1999-0064113 A | 7/1999 |
| KR | 2003-0070547 A | 8/2003 |
| WO | 2002/072930 A1 | 9/2002 |
| WO | WO 02/089152 A1 | 11/2002 |
| WO | 2003/068674 A1 | 8/2003 |
| WO | 2003/086961 A2 | 10/2003 |
| WO | 03/106573 A1 | 12/2003 |
| WO | 2004/005182 A1 | 1/2004 |
| WO | WO 2004/005413 | 1/2004 |
| WO | 2004/017700 A1 | 2/2004 |
| WO | 2004/034421 A2 | 4/2004 |
| WO | 2004/069736 A2 | 8/2004 |
| WO | 2004069737 A2 | 8/2004 |
| WO | 2004/097466 A1 | 11/2004 |
| WO | 2005/017962 A1 | 2/2005 |
| WO | 2005/023466 A1 | 3/2005 |
| WO | 2005/040460 A1 | 5/2005 |
| WO | 2006/006462 A1 | 1/2006 |
| WO | 2006/062160 A1 | 6/2006 |
| WO | 2006/113207 A2 | 10/2006 |
| WO | 2007/022226 | 2/2007 |
| WO | 2008/046058 | 4/2008 |

(56) References Cited

FOREIGN PATENT DOCUMENTS

| WO | 2008/131304 | 10/2008 |
|---|---|---|
| WO | 2009/017852 | 2/2009 |
| WO | 2009/018261 | 2/2009 |

OTHER PUBLICATIONS

Mbindyo, Template Synthesis of Metal Nanowires Containing Monolayer Molecular Junctionas, JACS, 2002, 124, p. 4020-4026.*
Huber, Polymer-Carbon Nanotube Composites A Literature Review, Defense Research and Development Canada, Aug. 2004 p. 1-47.*
Wu et al., "Transparent, Conductive Carbon Nanotube Films," Science 305(5688): 1273-1276, Aug. 27, 2004.
Adachi et al., "Formation of a Transparent Conductive Film Using Gold Nanowires," Source: Preprints for Annual Meeting of the Society of Chemical Engineers, vol. 67:660, 2002.
Adachi et al., "Gold Nanowire Formation of 2-Dimensional Network Structure with Electric Conductivity," *Journal of Chemical Engineering of Japan* 37(5):604-608, 2004.
Komatsu, M., "Morphology of Nanoparticles and Applications Thereof," *Chemical Sensors* 19 (A):118-120, 2003.
Hirata, H., "Gold Nanorod and its Properties," *Newer Metal Industry*, 2003.
Sun et al., "Crystalline Silver Nanowires by Soft Solution Processing," *Nano Letters* 2(2):165-168, 2002.
Walter et al., "Electrodeposition of Portable Metal Nanowire Arrays," *Physical Chemistry of Interfaces and Nanomaterials*, vol. 4807, 2002.
Wang et al., "Glucose Reduction Route Synthesis of Uniform Silver Nanowires in Large-scale," *Chemistry Letters* 33(9):1160-1161, 2004.
Yan et al., "DNA-Templated Self-Assembly of Protein Arrays and Highly Conductive Nanowires," *Science* 301:1882-1884. Sep. 26, 2003.
Kim et al., "Subbands in Carbon Nanotubes under Radial Deformation," *Journal of the Korean Physical Society* 37(2): 85-88, Aug. 2000.
Kuzumaki et al., "Dynamic measurement of electrical conductivity of carbon nanotubes during mechanical deformation by nanoprobe manipulation in transmission electron microscopy," *Appl. Phys. Lett.* 85(7): 1250-1252, Aug. 16, 2004.
Peng et al., "Carbon Nanotube Chemical and Mechanical Sensors," Conference Paper for the 3$^{rd}$ International Workshop on Structural Health Monitoring, 2001, 8 pages.
Advanced Nano Products, "Nano silver ink for ink jet printing," (Jun. 2, 2009 via Internet Wayback Machine), http://www.anapro.com/english/product/nano_silver.asp.
Chen et al., "The influence of seeding conditions and shielding gas atmosphere on the synthesis of silver nanowires through the polyol process," *Nanotechnology* 17:466-174, 2006.
Ducamp-Sanguesa et al., "Synthesis and Characterization of Fine and Monodisperse Silver Particles of Uniform Shape," *Journal of Solid State Chemistry, 100*: 272-280, 1992.
Filankembo et al., "Is the Anion the Major Parameter in the Shape Control of Nanocrystals?," *Journal of Physical Chemistry, 107*: 7492-7500, 2003.
International Search Report and Written Opinion dated Aug. 10, 2010, for PCT/US2010/033618, dated Aug. 10, 2010, 14 pages.
Jana et al., "Wet chemical synthesis of silver nanorods and nanowires of controllable aspect ratio," *Chemical Communications*: 617-618, 2001.
Kim et al., "Platonic Gold Nanocrystals," *Angewandte Chemie, 116*: 3759-3763, 2004.
Nikoobakht et al., "Preparation and Growth Mechanism of Gold Nanorods (NRs) Using Seed-Mediated Growth Method," *Chem. Mater., 15*: 1957-1962, 2003.
Okada et al., "Development of Fine Circuit Pattern Formation Process Using Nano-Metal Ink," *SEI Technical Review 62*: 54-57, 2006.
Silvert et al., "Preparation of colloidal silver dispersions by the polyol process Part 1—Synthesis and characterization," *J. Mater. Chem., 6* (4): 573-577, 1996.
Silvert et al., "Preparation of colloidal silver dispersions by the polyol process Part 2—Mechanism of particle formation," *J. Mater. Chem. 7* (2): 303-309, 1997.
Sun et al., "Large-Scale Synthesis of Uniform Silver Nanowires Through a Soft, Self-Seeding, Polyol Process," *Adv. Mater., 14* (11): 833-837, 2002.
Sun et al., "Polyol Synthesis of Uniform Silver Nanowires: A Plausible Growth Mechanism and the Supporting Evidence," *Nano Letters 3*(7): 955-960, 2003.
Sun et al., "Shape-Controlled Synthesis of Gold and Silver Nanoparticles," *Science, 298* (5601): 2176-2179, 2002.
Sun et al., "Template-Engaged Replacement Reaction: A One-step Approach to the Large-Scale Synthesis of Metal Nanostructures with Hollow Interiors," *Nano Letters 2*(5): 481-485, 2002.
Sun et al., "Uniform Silver Nanowires Synthesis by Reducing $AgNO_3$ with Ethylene Glycol in the Presence of Seeds and Poly (Vinyl Pyrrolidone)," *Chem. Mater., 14*: 4736-4745, 2002.
ULVAC Materials Division Inc., Establishment of the World's First Consortium for the Development and Commercialization of Next-Generation Functional Circuit Boards Using Nano Paste (Oct. 23, 2002), http://www.ulvac.co.jp/eng/information/news/2002/20021023.html.
ULVAC Materials Division Inc., "Nano-metal Ink" (Apr. 7, 2011), http://www.ulvac.co.jp/eng/products/materials/nanoparticle-technology.html.
Wiley et al., "Polyol Synthesis of Silver Nanoparticles: Use of Chloride and Oxygen to Promote the Formation of Single-Crystal, Truncated Cubes and Tetrahedrons," *Nano Letters 4*(10): 2057, 2004.
Wiley et al., "Polyol Synthesis of Silver Nanostructures: Control of Product Morphology with Fe (II) or Fe (III) Species," *Langmuir, 21* (18): 8077-8080, 2005.
Xinling Tang et al., "Rapid and high-yield synthesis of silver nanowires using air-assisted polyol method with chloride ions," *Colloids and surfaces A: Physicochemical and Engineering Aspects, 338*:33-39, 2009.
Yang et al., "Anisotropic syntheses of boat-shaped core-shell Au-Ag nanocrystals and nanowires," *Nanotechnology 17*: 2304-2310, 2006.
Knapp et al., "Nanowire Based Transparent Conductors," U.S. Appl. No. 60/796,027, filed Apr. 28, 2006, 42 pages.
Knapp et al., "Nanowires-Based Transparent Conductors," U.S. Appl. No. 60/798,878, filed May 8, 2006, 84 pages.
Messer et al., "Microchannel Networks for Nanowire Patterning," *J. Am. Chem. Soc. 122*:10232- 10233, 2000.
Pakbaz et al., "Methods of Forming and the Structure of Transparent Electrical Conductors," U.S. Appl. No. 60/707,675, filed Aug. 12, 2005, 48 pages.

* cited by examiner

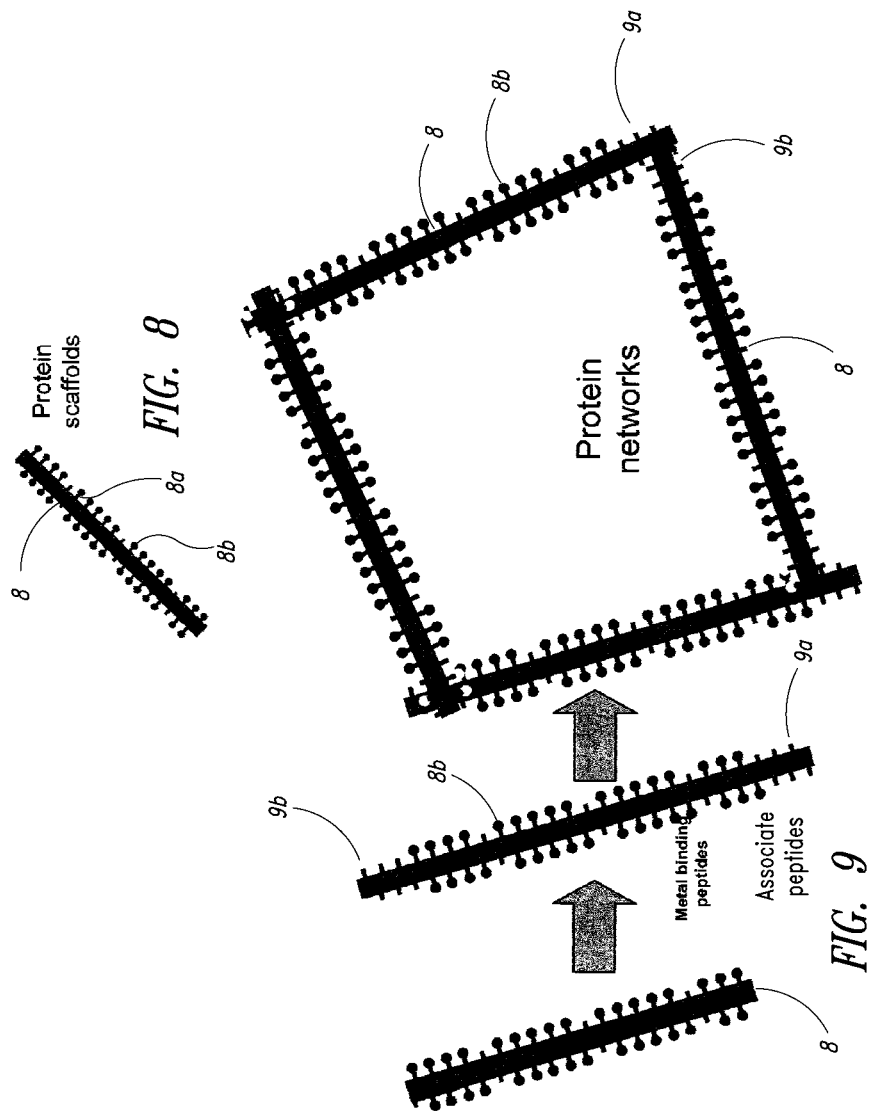

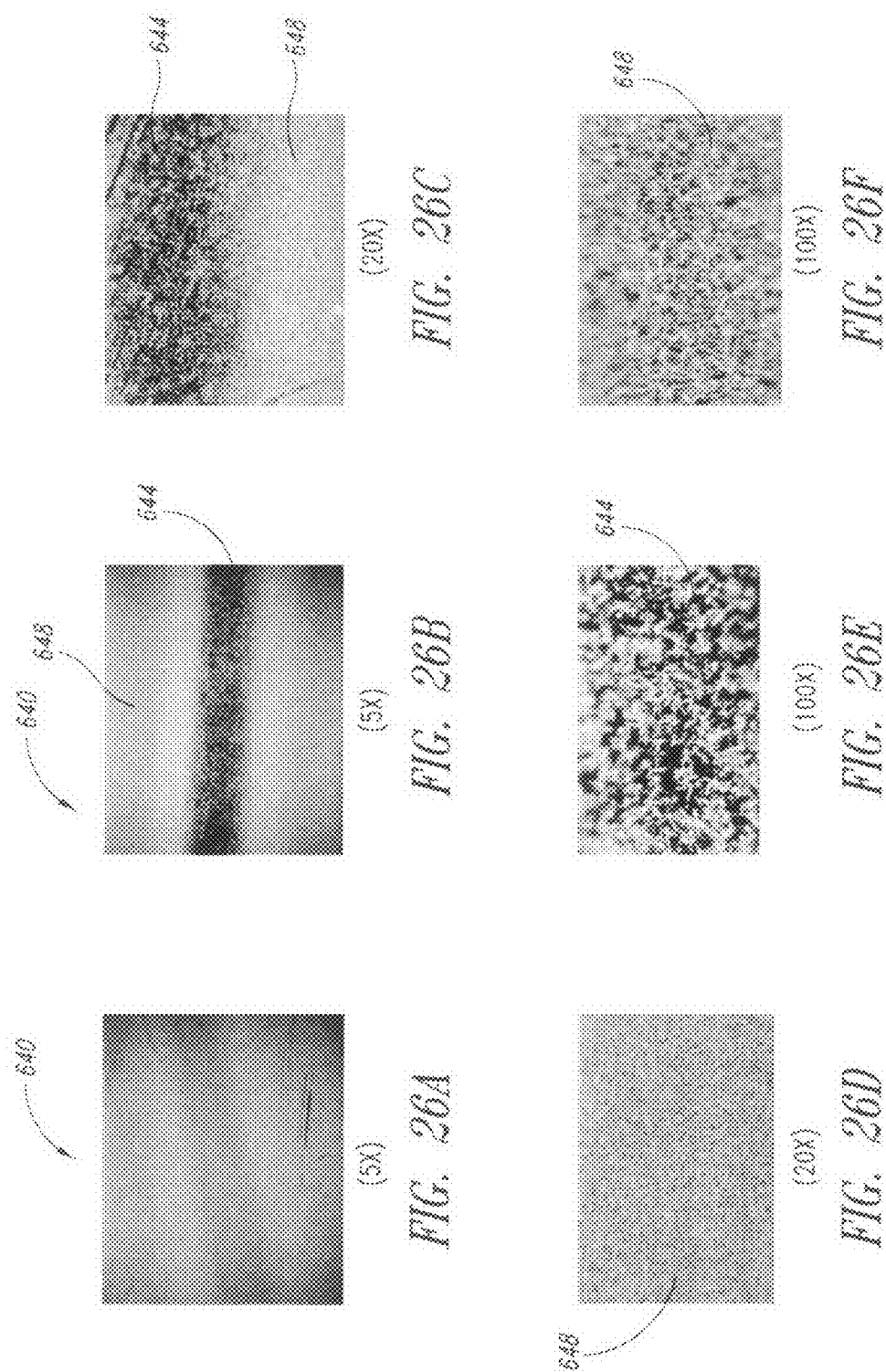

NANOWIRES-BASED TRANSPARENT CONDUCTORS

CROSS-REFERENCES TO RELATED APPLICATIONS

This application is a divisional of U.S. patent application Ser. No. 11/504,822 filed Aug. 14, 2006, now pending; which claims the benefit under 35 U.S.C. § 119(e) of U.S. Provisional Patent Application No. 60/707,675 filed Aug. 12, 2005, U.S. Provisional Patent Application No. 60/796,027 filed Apr. 28, 2006, and U.S. Provisional Patent Application No. 60/798,878 filed May 8, 2006; all of these applications are incorporated herein by reference in their entireties.

BACKGROUND

Technical Field

This invention is related to transparent conductors and methods of manufacturing the same, in particular, to high-throughput coating methods.

Description of the Related Art

Transparent conductors refer to thin conductive films coated on high-transmittance insulating surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells, as anti-static layers and as electromagnetic wave shielding layers.

Currently, vacuum deposited metal oxides, such as indium tin oxide (ITO), are the industry standard materials to provide optically transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. There also may be issues with the adhesion of metal oxide films to substrates that are prone to adsorbing moisture such as plastic and organic substrates, e.g. polycarbonates. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

Conductive polymers have also been used as optically transparent electrical conductors. However, they generally have lower conductivity values and higher optical absorption (particularly at visible wavelengths) compared to the metal oxide films, and suffer from lack of chemical and long-term stability.

Accordingly, there remains a need in the art to provide transparent conductors having desirable electrical, optical and mechanical properties, in particular, transparent conductors that are adaptable to any substrates, and can be manufactured and patterned in a low-cost, high-throughput process.

BRIEF SUMMARY

In one embodiment, it is described herein a transparent conductor comprising: a substrate; and a conductive layer on the substrate, the conductive layer including a plurality of nanowires, preferably, metal nanowires.

In another embodiment, a transparent conductor comprises a substrate; and a conductive layer on the substrate, the conductive layer including a plurality of metal nanowires embedded in a matrix, in particular, an optically clear polymeric matrix.

In yet another embodiment, the transparent conductor further comprises a corrosion inhibitor.

In a further embodiment, it is described herein a method of fabricating a transparent conductor comprising: depositing a plurality of metal nanowires on a substrate, the metal nanowires being dispersed in a fluid; and forming a metal nanowire network layer on the substrate by allowing the liquid to dry.

In another embodiment, a method comprises depositing a plurality of metal nanowires on a substrate, the metal nanowires being dispersed in a fluid; and forming a metal nanowire network layer on the substrate by allowing the liquid to dry; depositing a matrix material on the metal nanowire network layer; and curing the matrix material to form a matrix, the matrix and the metal nanowires embedded therein forming a conductive layer.

In a further embodiment, the method described herein can be performed in a reel-to reel process, wherein the substrate is driven by a rotating reel along a traveling path, and the depositing of the metal nanowires is carried out at a first deposition station along the traveling path, and the depositing of the matrix material is carried out at a second deposition station along the traveling path.

In another embodiment, the conductive layer can be patterned, in particular, photo-patterned by using photo-curable matrix materials.

In another embodiment, it is described herein a laminated structure comprising: a flexible donor substrate; and a conductive layer including a matrix embedded with a plurality of metal nanowires.

In a further embodiment, a laminating process is described, the process comprising: applying the laminated structure to a substrate of choice, and removing the flexible donor substrate.

In yet another embodiment, a display device is described, the display device comprising at least one transparent electrode having a conductive layer, the conductive layer including a plurality of metal nanowires. In particular, the conductive layer comprises the metal nanowires in an optically clear polymeric matrix.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

FIG. 8 illustrates a protein scaffold coupled to conductive particles via various binding sites.

FIG. 9 illustrates the formation of a conductive network of biological templates based on the coupling of associate peptides.

FIGS. 26A-26F show photographs of the patterned conductive films before and after an adhesive tape treatment at various levels of magnification.

DETAILED DESCRIPTION

Certain embodiments are directed to a transparent conductor based on a conductive layer of nanowires. In particular, the conductive layer includes a sparse network of metal nanowires. In addition, the conductive layer is transparent, flexible and can include at least one surface that is conductive. It can be coated or laminated on a variety of substrates, including flexible and rigid substrates. The conductive layer can also form part of a composite structure including a matrix material and the nanowires. The matrix material can typically impart certain chemical, mechanical and optical properties to the composite structure. Other embodiments describe methods of fabricating and patterning the conductive layer.

Conductive Nanowires

Figure 1:
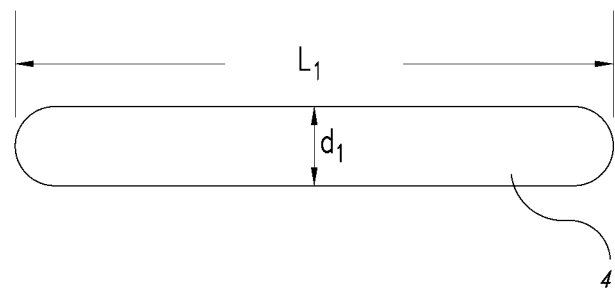
FIG. 1 is a schematic illustration of a nanowire.

FIG. 1 illustrates a nanowire 2 having an aspect ratio equal to the length $L_1$ divided by the diameter $d_1$. Suitable nanowires typically have aspect ratios in the range of 10 to 100,000. Larger aspect ratios can be favored for obtaining a transparent conductor layer since they may enable more efficient conductive networks to be formed while permitting lower overall density of wires for a high transparency. In other words, when conductive nanowires with high aspect ratios are used, the density of the nanowires that achieves a conductive network can be low enough that the conductive network is substantially transparent.

One method to define the transparency of a layer to light is by its absorption coefficient. The illumination of light passing through a layer can be defined as:

$$I = I_o e^{-\alpha x}$$

in which $I_o$ is the incoming light on a first side of the layer, I is the illumination level that is present on a second side of the layer, and $e^{-\alpha x}$ is the transparency factor. In the transparency factor, α is the absorption coefficient and x is the thickness of the layer. A layer having a transparency factor near 1, but less than 1 can be considered to be substantially transparent.

FIGS. 2-5 illustrate some of the optical and electrical characteristics of the conductive nanowires.

Figure 2:
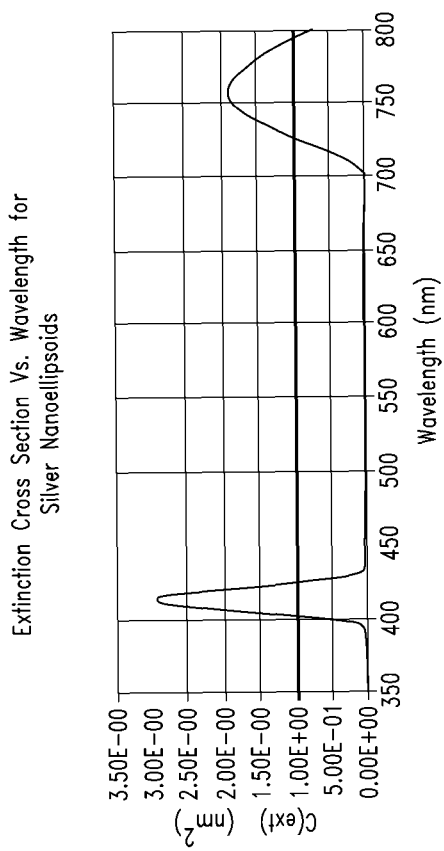
FIG. 2 is a graph illustrating the expected optical properties of a silver nanoellipsoids at various wavelengths of light.

FIG. 2 shows a theoretical model of the light absorption of silver nanoellipsoids at various wavelengths of light. Depending on widths and lengths, silver nanoellipsoids exhibit a high extinction coefficient to a narrow band of light in the wavelengths between 400 and 440 nanometers and to wavelengths of light above 700 nm. However, they are substantially transparent between about 440 to about 700 nm, which falls in the visible range.

Figure 3:
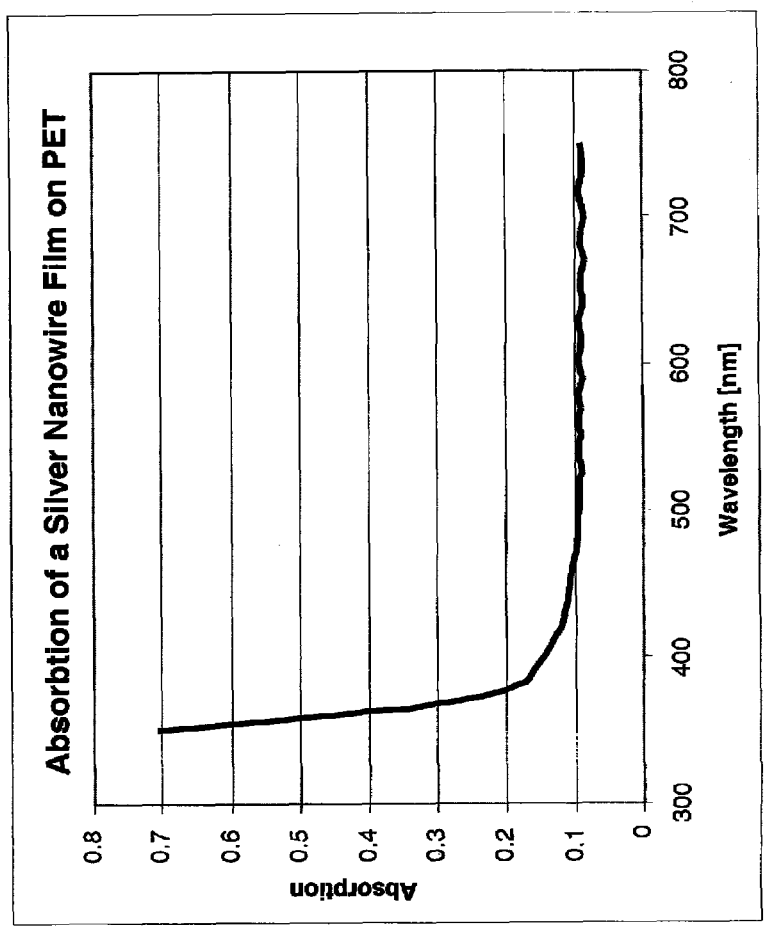
FIG. 3 illustrates the absorption spectrum of a silver nanowire layer on a polyethylene terephthalate (PET) substrate.

FIG. 3 shows the absorption spectrum of a layer of silver nanowires deposited on a polyethylene terephthalate (PET) substrate. As shown by the absorption profile, the silver nanowire layer on PET substrate is substantially transparent between about 440 nm to 700 nm, agreeing with the results of the theoretical model shown in FIG. 2.

Figure 4:
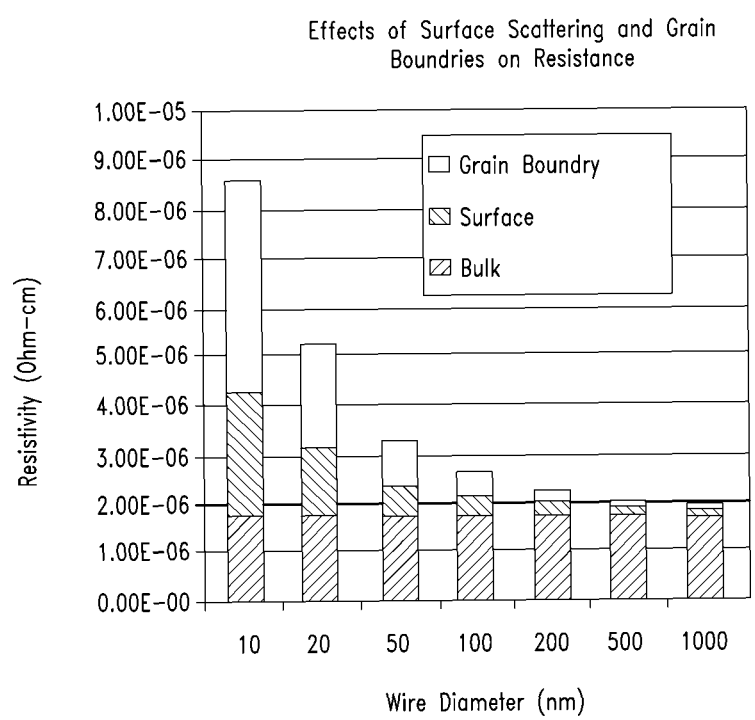
FIG. 4 is a graph illustrating expected values for various resistivity properties of a nanowire based on the wire diameter.
Figure 5:
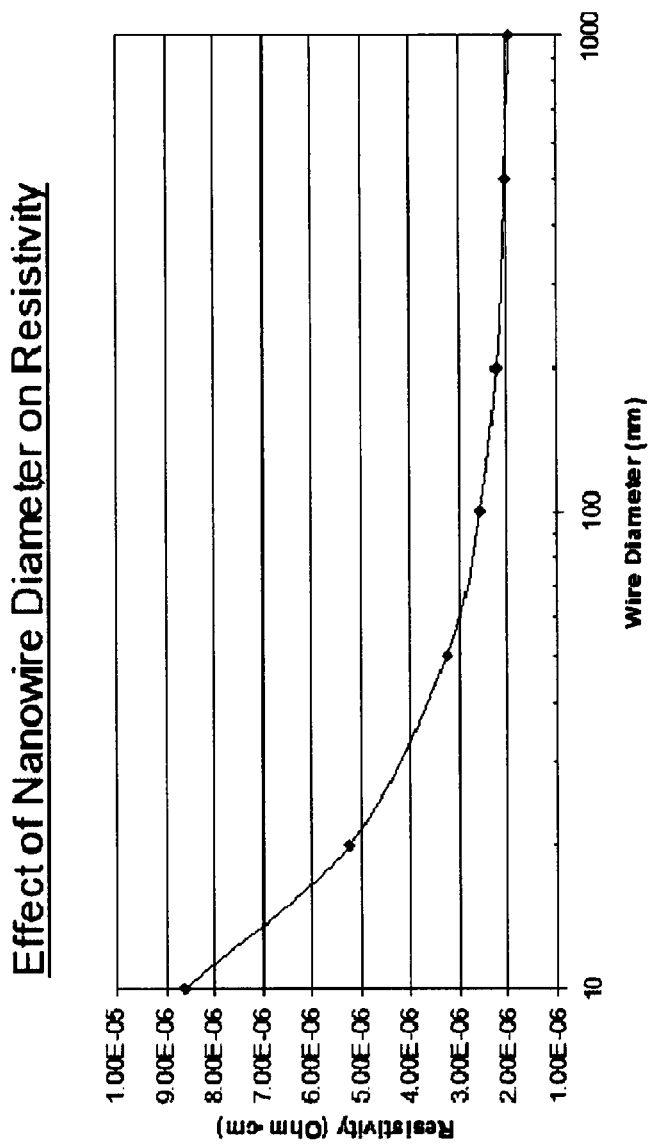
FIG. 5 is a graph illustrating the expected overall resistivity as a function of the diameters of nanowires.

FIGS. 4 and 5 show the results of theoretical modeling of the resistivity of metal nanowires based on their diameters.

For a larger diameter of nanowire, the resistivity decreases substantially although it will absorb more light. As can be seen in FIG. 4, the effects on resistivity based on the grain boundary and surface scattering are high at diameters of less than 10 nm. As the diameter increases, these effects are drastically reduced. The overall resistivity is therefore reduced greatly for diameter that increases from 10 nm to over 100 nm (see, also FIG. 5). This improvement in electrical properties must be balanced, however, against the decreased transparency for applications requiring a transparent conductor.

Figure 6:
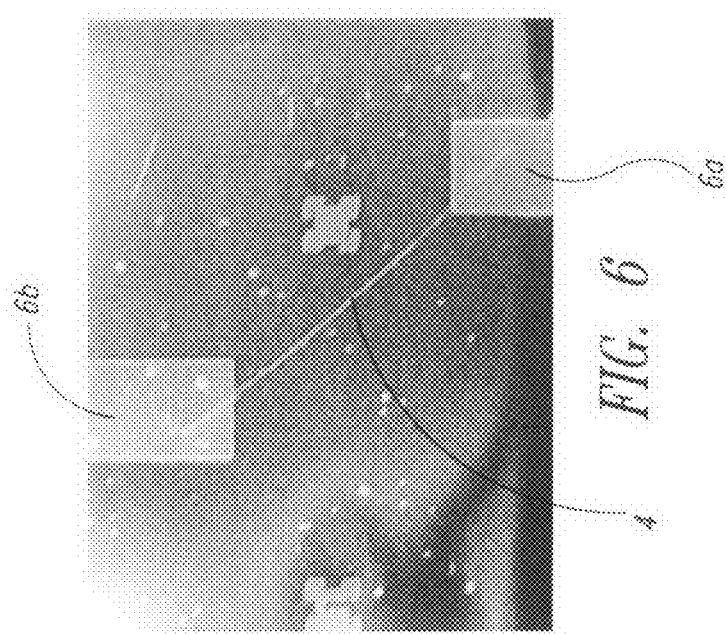
FIG. 6 shows an SEM image of a single silver nanowires connecting between two metal contacts.

FIG. 6 shows a single Ag nanowire 4 that extends between two other electrical terminals 6a and 6b, to provide an electrically conductive path from terminal 6a to terminal 6b. The term "terminal" includes contact pads, conduction nodes and any other starting and ending points that may be electrically connected. The aspect ratio, size, shape and the distribution of the physical parameters of the nanowires are selected to provide the desired optical and electrical properties. The number of such wires that will provide a given density of Ag nanowires is selected to provide acceptable electrical conduction properties for coupling terminal 6a to terminal 6b. For example, hundreds of Ag nanowires 4 can extend from terminal 6a to 6b to provide a low resistance electrical conduction path, and the concentration, aspect ratio, size and shape can be selected to provide a substantially transparent conductor. Therefore, transparent, electrical conduction is provided from terminal 6a to terminal 6b using a plurality of Ag nanowires.

As can be appreciated, the distance from terminal 6a to terminal 6b may be such that the desired optical properties are not obtained with a single nanowire. A plurality of many nanowires may need to be linked to each other at various points to provide a conductive path from terminal 6a to terminal 6b. According to the invention, the nanowires are selected based on the desired optical properties. Then, the number of nanowires that provides the desired conduction path and overall resistance on that path are selected to achieve acceptable electrical properties for an electrical conduction layer from terminal 6a to terminal 6b.

The electrical conductivity of the transparent layer is mainly controlled by a) the conductivity of a single nanowire, b) the number of nanowires between the terminals, and c) the connectivity between the nanowires. Below a certain nanowire concentration (also referred as the percolation threshold), the conductivity between the terminals is zero, i.e. there is no continuous current path provided because the nanowires are spaced too far apart. Above this concentration, there is at least one current path available. As more current paths are provided, the overall resistance of the layer will decrease.

Conductive nanowires include metal nanowires and other conductive particles having high aspect ratios (e.g., higher than 10). Examples of non-metallic nanowires include, but are not limited to, carbon nanotubes (CNTs), metal oxide nanowires, conductive polymer fibers and the like.

As used herein, "metal nanowire" refers to a metallic wire comprising element metal, metal alloys or metal compounds (including metal oxides). At least one cross sectional dimension of the metal nanowire is less than 500 nm, and less than 200 nm, and more preferably less than 100 nm. As noted above, the metal nanowire has an aspect ratio (length:width) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared according to the methods described in, e.g., Xia, Y. et al., *Chem. Mater.* (2002), 14, 4736-4745, and Xia, Y. et al., *Nanoletters* (2003) 3(7), 955-960.

Alternatively, the metal nanowires can be prepared using biological templates (or biological scaffolds) that can be mineralized. For example, biological materials such as viruses and phages can function as templates to create metal nanowires. In certain embodiments, the biological templates can be engineered to exhibit selective affinity for a particular type of material, such as a metal or a metal oxide. More detailed description of biofabrication of nanowires can be found in, e.g., Mao, C. B. et al., "Virus-Based Toolkit for the Directed Synthesis of Magnetic and Semiconducting Nanowires," (2004) *Science,* 303, 213-217. Mao, C. B. et al., "Viral Assembly of Oriented Quantum Dot Nanowires," (2003) *PNAS, vol.* 100, no. 12, 6946-6951; Mao, C. B. et al., "Viral Assembly of Oriented Quantum Dot Nanowires," (2003) *PNAS,* 100(12), 6946-6951, U.S. application Ser. No. 10/976,179, and U.S. Provisional Application Ser. No. 60/680,491, which references are incorporated herein in their entireties.

More specifically, a conductive material or a conductor (e.g., a metal nanowire) can directly bind to a biological template based on an affinity between the conductive material and certain binding sites (e.g., peptide sequences) on the biological template.

In other embodiments, a conductive material can be created by a nucleation process, during which a precursor is converted to conductive particles that bind to the biological templates, the conductive particles being capable of further growing into a continuous conductive layer. This process is also referred to as "mineralization" or "plating". For example, a metal precursor (e.g., a metal salt) can be converted to an elemental metal in the presence of a reducing agent. The resulting elemental metal binds to the biological templates and grows into a continuous metallic layer.

In other embodiments, a seed material layer is initially nucleated onto the biological material. Thereafter, a metal precursor can be converted into metal and plated on the seed material layer. The seed material can be selected, for example, based on a material that causes the nucleation and growth of a metal out of a solution containing a corresponding metal precursor. To illustrate, a seed material layer containing palladium can cause the mineralization of Cu or Au. As one specific example, for creating a Cu conductor, acceptable seed materials may contain palladium, a palladium based molecule, Au or an Au based molecule. For an oxide conductor, a zinc oxide may be used as a nucleation material. Examples of the seed material include Ni, Cu, Pd, Co, Pt, Ru, Ag, Co alloys or Ni alloys. Metals, metal alloys and metal oxides that can be plated include, without limitation, Cu, Au, Ag, Ni, Pd, Co, Pt, Ru, W, Cr, Mo, Ag, Co alloys (e.g., CoPt), Ni alloys, Fe alloys (e.g., FePt) or $TiO_2$, $Co_3O_4$, $Cu_2O$, $HfO_2$, ZnO, vanadium oxides, indium oxide, aluminum oxide, indium tin oxide, nickel oxide, copper oxide, tin oxide, tantalum oxide, niobium oxide, vanadium oxide or zirconium oxide.

Any of a number of different biological materials can be used to provide the templates for creating the metal nanowires, including proteins, peptides, phages, bacteria, viruses, and the like. The techniques for selecting, forming and engineering a biological material that will couple to a desired metal or conductive material are described in U.S. application Ser. Nos. 10/155,883 and 10/158,596; both applications are in the name of Cambrios Technologies Corporation and are incorporated herein by reference.

As noted above, biological templates such as protein, a peptide, or other biological material can be engineered to have affinity sites for a selected seed material or a selected conductive material. Proteins or peptides with affinity to a specific material can be identified through a protein discovery process such as phage display, yeast display, cell surface display or others. For example in the case of phage display, libraries of phages (e.g., M13 phages) can be created by inserting a wide variety of different sequences of peptides into a population of the phage. A protein having high affinity for a specific target molecule can be isolated and its peptide structure can be identified.

In particular, the genetic sequences of the biological molecules can be controlled to provide a number of copies of particular peptide sequences in certain types of phage particles. For example, about 3000 copies of P8 proteins can be arranged in an ordered array along the length of M13 phage particles. The P8 proteins can be modified to include a specific peptide sequence that can nucleate the formation of or bind a conductive material, thereby providing conductive nanowires of high conductivity. Advantageously, this technique allows for the ability to control the geometry and crystalline structure of the nanowires through the use of biological template molecules, e.g., proteins having specifically designed or controlled peptide sequences. To that end, peptides or proteins with binding affinity for silver, gold or palladium have been identified which can be incorporated into a phage structure to create nanowires with dimensions based on those of the phage particles.

Figure 7:
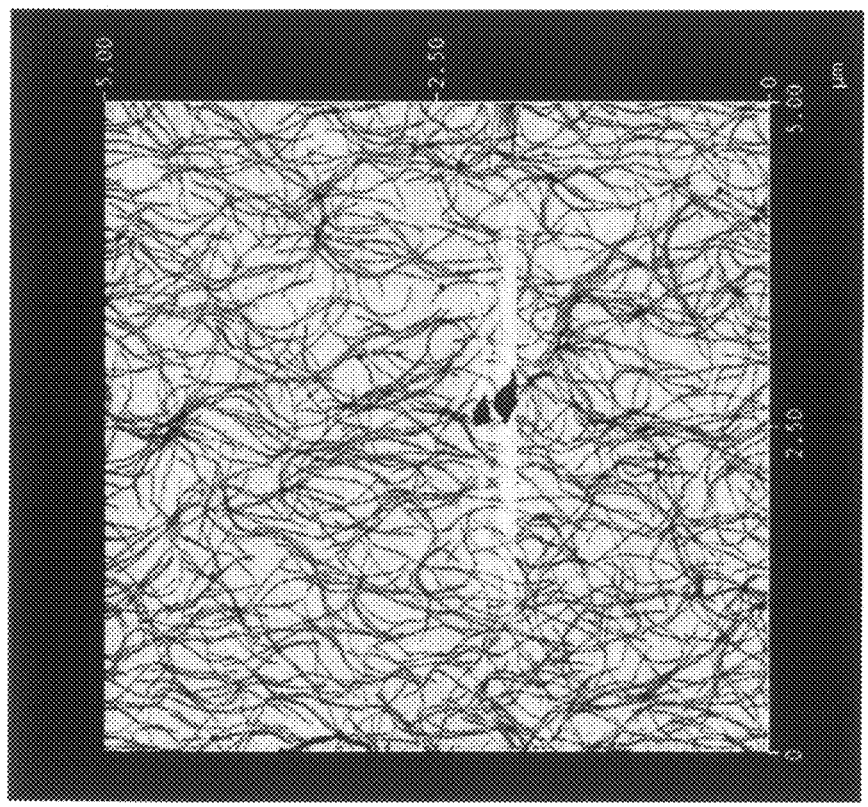
FIG. 7 illustrates a network of filamentous proteins that function as biological templates for a transparent conductor.

Biological materials other than phages can be used as templates for the formation of conductive nanowires. For example, filamentous proteins which self-assemble into long strands of tens of microns in length can be used as an alternative template (see, FIG. 7). Advantageously, such a template protein can be synthesized to have a much larger aspect ratio than phage, which leads to lower percolative threshold concentrations of the conductive nanowires. Additionally, proteins are easier to synthesize in large volume than phage particles. Large scale manufacture of proteins, such as enzymes used as detergent additives, is well developed.

FIG. 8 shows a schematic version of a protein scaffold 8 having a number of binding sites 8a coupled with conductive particles 8b. The binding sites are selected to have an affinity for the conductive particles, such as Au, Ag, Cu and Ni. Alternatively, the binding sites 8a have an affinity for a seed material layer (e.g., Pd and Au) that can further nucleate the conductive particles, such as Cu and the like. The protein scaffold 8 can also be engineered to have a plurality of binding sites 8a with such affinity. It is preferred to have them spaced at frequent and regular intervals along their length to increase the conductivity of the final conductive layer.

The length of a biological material, such as a protein, as well as its diameter is easily engineered using known techniques. It is engineered to have the correct dimensions for the optical properties. Once the size, shape and aspect ratio have been selected, the biological material can be exposed to conductive material 8b, such as a metal, or a precursor of the metal.

FIG. 9 illustrates a further embodiment of fabricating conductive nanowires using biological templates. The protein scaffold 8 can be further engineered to include binding partners such as associate peptides 9a and 9b at respective ends. Binding partners can couple with each other through any type of associative interaction, including, for example, ionic interaction, covalent bonding, hydrogen bonding, hydrophobic interaction, and the like. The interaction between the associate peptides 9a and 9b encourage the self-assembly of the conductive nanowires into 2-D interconnected mesh networks, as shown in the final sequence in FIG. 8. The association peptides and their locations may be of the type to encourage the forming of meshes, end to end connection, cross-connections, and other desired shapes for the conductive layer. In the example shown in FIG. 8, the conductive material 8b has already bound to the protein scaffold 8 before the protein scaffolds form a network. It should be understood, that protein scaffold 8 can also form a network prior to the binding of the conductive material.

Thus the use of biological template having associate peptides or other binding partners allows for the formation of a conductive layer of highly connected network than would be possible with random nanowires. The particular network of the biological templates can therefore be selected to achieve a desired degree of order in the conductive layer.

Template-based synthesis is particularly suited for fabricating nanowires of particular dimensions, morphologies and compositions. Further advantages of biologically based manufacturing of nano-materials include: solution processing that can be modified for high throughput, ambient temperature deposition, superior conformality and production of conductive layers.

Conductive Layer and Substrate

Figure 10A:
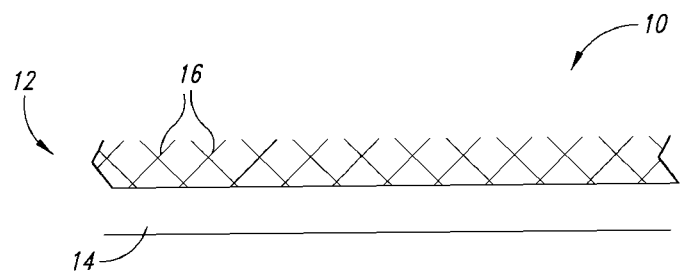
FIG. 10A illustrates schematically an embodiment of a metal nanowires-based transparent conductor.

As an illustrative example, FIG. 10A shows a transparent conductor 10 comprising a conductive layer 12 coated on a substrate 14. The conductive layer 12 comprises a plurality of metal nanowires 16. The metal nanowires form a conductive network.

Figure 10B:
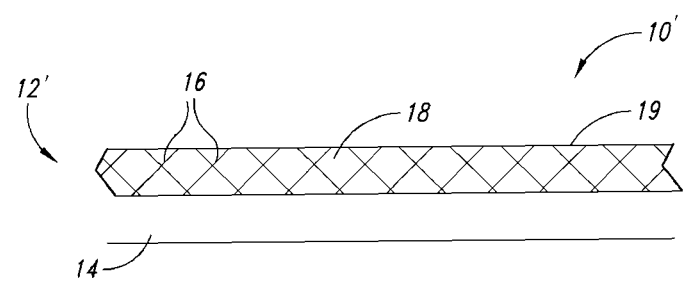
FIG. 10B illustrates schematically another embodiment of a metal nanowires-based transparent conductor.

FIG. 10B shows another example of a transparent conductor 10', in which a conductive layer 12' is formed on the substrate 14. The conductive layer 12' includes a plurality of metal nanowires 16 embedded in a matrix 18.

"Matrix" refers to a solid-state material into which the metal nanowires are dispersed or embedded. Portions of the nanowires may protrude from the matrix material to enable access to the conductive network. The matrix is a host for the metal nanowires and provides a physical form of the conductive layer. The matrix protects the metal nanowires from adverse environmental factors, such as corrosion and abrasion. In particular, the matrix significantly lowers the permeability of corrosive elements in the environment, such as moisture, trace amount of acids, oxygen, sulfur and the like.

In addition, the matrix offers favorable physical and mechanical properties to the conductive layer. For example, it can provide adhesion to the substrate. Furthermore, unlike metal oxide films, polymeric or organic matrices embedded with metal nanowires can be robust and flexible. As will be discussed in more detail herein, flexible matrices make it possible to fabricate transparent conductors in a low-cost, high throughput process.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material is considered optically clear if the light transmission of the material is at least 80% in the visible region (400 nm-700 nm). Unless specified otherwise, all the layers (including the substrate) in a transparent conductor described herein are preferably optically clear. The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix is about 10 nm to 5 μm thick, about 20 nm to 1 μm thick, or about 50 nm to 200 nm thick. In other embodiments, the matrix has a refractive index of about 1.3 to 2.5, or about 1.35 to 1.8.

In certain embodiments, the matrix is a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the matrix is an inorganic material. For example, a sol-gel matrix based on silica, mullite, alumina, SiC, MgO—$Al_2O_3$—$SiO_2$, $Al2O3$—$SiO_2$, MgO—$Al_2O_3$—$SiO_2$—$Li_2O$ or a mixture thereof can be used.

In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, and polydiacetylenes.

"Conductive layer", or "conductive film", refers to a network layer of metal nanowires that provide the conductive media of the transparent conductor. When a matrix is present, the combination of the network layer of metal nanowires and the matrix is also referred to as a "conductive layer". Since conductivity is achieved by electrical charge percolation from one metal nanowire to another, sufficient metal nanowires must be present in the conductive layer to reach an electrical percolation threshold and become conductive. The surface conductivity of the conductive layer is inversely proportional to its surface resistivity, sometimes referred to as sheet resistance, which can be measured by known methods in the art.

Likewise, when a matrix is present, the matrix must be filled with sufficient metal nanowires to become conductive. As used herein, "threshold loading level" refers to a percentage of the metal nanowires by weight after loading of the conductive layer at which the conductive layer has a surface resistivity of no more than about $10^6 \Omega$/square (or $\Omega/\square$). The threshold loading level depends on factors such as the aspect ratio, the degree of alignment, degree of agglomeration and the resistivity of the metal nanowires.

As is understood by one skilled in the art, the mechanical and optical properties of the matrix are likely to be altered or compromised by a high loading of any particles therein. Advantageously, the high aspect ratios of the metal nanowires allow for the formation of a conductive network through the matrix at a threshold surface loading level preferably of about 0.05 μg/cm² to about 10 μg/cm², more preferably from about 0.1 μg/cm² to about 5 μg/cm² and more preferably from about 0.8 μg/cm² to about 3 μg/cm² for silver nanowires. These surface loading levels do not affect the mechanical or optical properties of the matrix. These values depend strongly on the dimensions and spatial dispersion of the nanowires. Advantageously, transparent conductors of tunable electrical conductivity (or surface resistivity) and optical transparency can be provided by adjusting the loading levels of the metal nanowires.

In certain embodiments, the conductive layer spans the entire thickness of the matrix, as shown in FIG. 10B. Advantageously, a certain portion of the metal nanowires is exposed on a surface 19 of the matrix due to the surface tension of the matrix material (e.g., polymers). This feature is particularly useful for touch screen applications. In particular, a transparent conductor can display surface conductivity on at least one surface thereof. FIG. 10C illustrates how it is believed the network of metal nanowires embedded in a matrix achieves surface conductivity. As shown, while some nanowires, such as nanowire 16a, may be entirely 'submerged' in the matrix 18, ends of other nanowires, such as end 16b, protrude above the surface 19 of the matrix 18. Also, a portion of a middle section of nanowires, such as middle section 16c, may protrude above the surface 19 of the matrix 18. If enough nanowire ends 16b and middle sections 16c protrude above the matrix 18, the surface of the transparent conductor becomes conductive. FIG. 10D is a scanning electron micrograph of the surface of one embodiment of a transparent conductor showing a contour of ends and middle sections of nanowires protruding above a matrix in a transparent conductor.

Figure 10E:
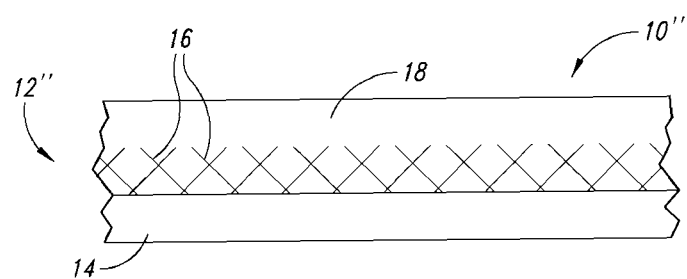
FIG. 10E illustrates schematically another embodiment of a metal nanowires-based transparent conductor.
Figure 10C:
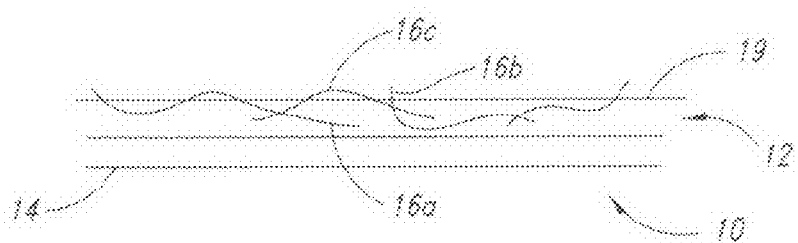
FIG. 10C shows schematically a further embodiment of a metal nanowire based transparent conductor in which portions of the nanowires are exposed on a surface of the transparent conductor.
Figure 10D:
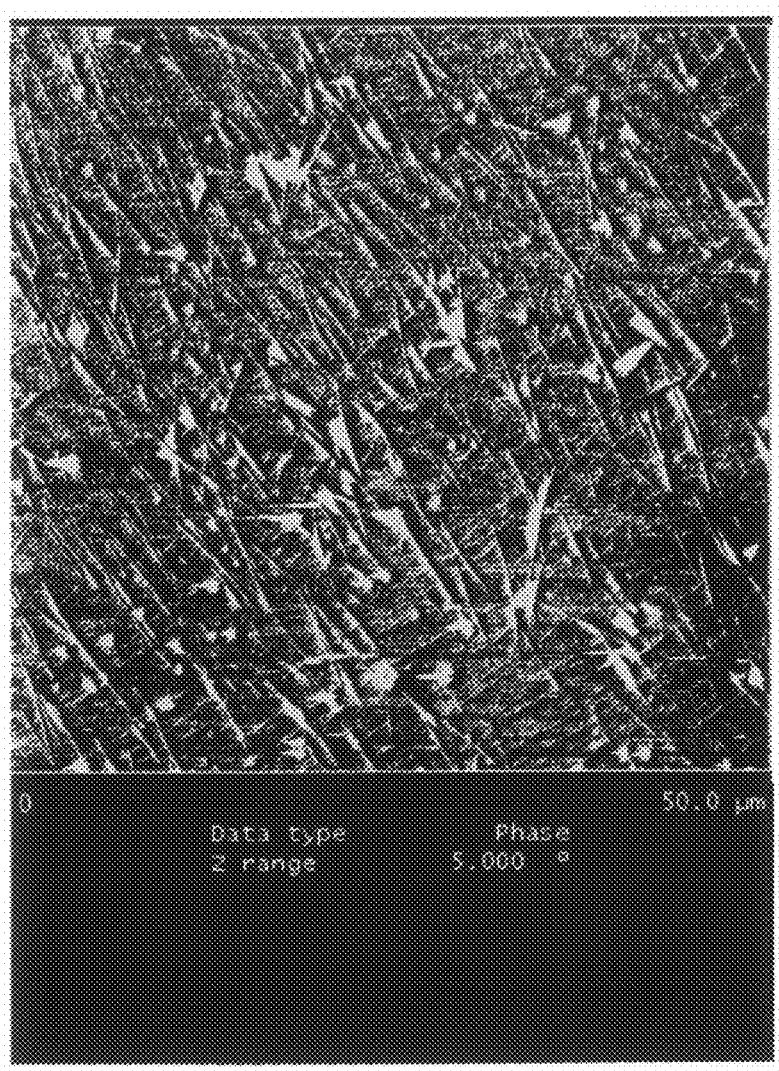
FIG. 10D shows an SEM image of silver nanowires protruding out of a surface of the transparent conductor.

In other embodiments, the conductive layer is formed by the metal nanowires embedded in a portion of the matrix, as shown in FIG. 10E. The conductive layer 12" occupies only a portion of the matrix 18 and are completely "submerged" in the matrix 18.

"Substrate", or "substrate of choice", refers to a material onto which the conductive layer is coated or laminated. The substrate can be rigid or flexible. The substrate can be clear or opaque. The term "substrate of choice" is typically used in connection with a lamination process, as will be discussed herein. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Typically, the optical transparence or clarity of the conductive layer can be quantitatively defined by parameters including light transmission and haze. "Light transmission" refers to the percentage of an incident light transmitted through a medium. In various embodiments, the light transmission of the conductive layer is at least 80% and can be as high as 98%. For a transparent conductor in which the conductive layer is deposited or laminated on a substrate, the light transmission of the overall structure may be slightly diminished. Performance-enhancing layers, such as an adhesive layer, anti-reflective layer, anti-glare layer, may further contribute to reducing the overall light transmission of the transparent conductor. In various embodiments, the light transmission of the transparent conductors can be at least 50%, at least 60%, at least 70%, or at least 80% and may be as high as at least 91% to 92%.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In various embodiments, the haze of the transparent conductor is no more than 10%, no more than 8%, or no more than 5% and may be as low as no more than 2% to 0.5%.

Performance-enhancing Layers

As noted above, the conductive layers have superior physical and mechanical characteristics due to the matrix. These characteristics can be further enhanced by introducing additional layers in the transparent conductor structure. Thus, in other embodiments, a multi-layer transparent conductor is described, which comprises one or more layers such as anti-reflective layers, anti-glare layers, adhesive layers, barrier layers, and hard coats.

Figure 11:
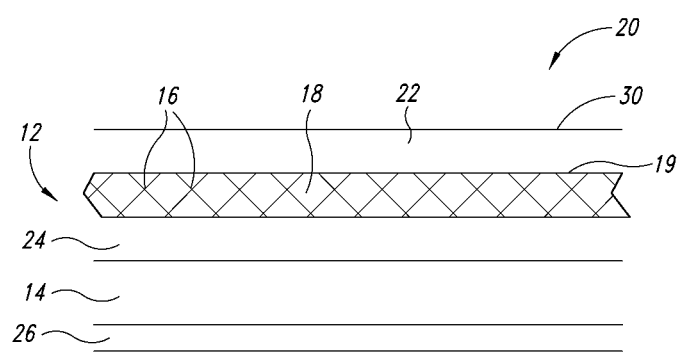
FIG. 11 illustrates schematically a further embodiment of a metal nanowires-based transparent conductor having a multi-layer structure.

As an illustrative example, FIG. 11 shows a multi-layer transparent conductor 20 comprising a conductive layer 12 and a substrate 14, as described above. The multi-layer transparent conductor 20 further comprises a first layer 22 positioned over the conductive layer 12, a second layer 24 positioned between the conductive layer 12 and the substrate 14, and a third layer 26 positioned below the substrate 14. Unless stated otherwise, each of the layers 22, 24 and 26 can be one or more anti-reflective layers, anti-glare layers, adhesive layers, barrier layers, hard coats, and protective films.

The layers 22, 24 and 26 serve various functions, such as enhancing the overall optical performance and improving the mechanical properties of the transparent conductor. These additional layers, also referred to as "performance-enhancing layers", can be one or more anti-reflective layers, anti-glare layers, adhesive layers, barrier layers, and hard coats. In certain embodiments, one performance-enhancing layer provides multiple benefits. For example, an anti-reflective layer can also function as a hard coat and/or a barrier layer. In addition to their specific properties, the performance-enhancing layers are optically clear, as defined herein.

In one embodiment, layer 22 is an anti-reflective layer, layer 24 is an adhesive layer, and layer 26 is a hard coat.

In another embodiment, layer 22 is a hard coat, layer 24 is a barrier layer, and layer 26 is an anti-reflective layer.

In yet another embodiment, layer 22 is a combination of an anti-reflective layer, anti-glare, a barrier layer and a hard coat, layer 24 is an adhesive layer, and layer 26 is an anti-reflective layer.

"Anti-reflective layer" refers to a layer that can reduce reflection loss at a reflective surface of the transparent conductor. The anti-reflective layer can therefore be positioned on the outer surfaces of the transparent conductor, or as an interface between layers. Materials suitable as anti-reflective layers are well known in the art, including without limitation: fluoropolymers, fluoropolymer blends or copolymers, see, e.g., U.S. Pat. Nos. 5,198,267, 5,225,244, and 7,033,729.

In other embodiments, reflection loss can be effectively reduced by controlling the thickness of the anti-reflective layer. For example, with reference to FIG. 11, the thickness of layer 22 can be controlled such that the light reflection of surface 28 and surface 30 cancel each other out. Thus, in various embodiments, the anti-reflective layer is about 100 nm thick or 200 nm thick.

Reflection loss can also be reduced by the appropriate use of textured surfaces, see, e.g. U.S. Pat. No. 5,820,957 and literature on Autoflex MARAG™ and Motheye™ products from MacDiarmid Autotype.

"Anti-glare layer" refers to a layer that reduces unwanted reflection at an outer surface of the transparent conductor by providing fine roughness on the surface to scatter the reflection. Suitable anti-glare materials are well known in the art, including without limitation, siloxanes, polystyrene/PMMA blend, lacquer (e.g., butyl acetate/nitrocellulose/wax/alkyd resin), polythiophenes, polypyrroles, polyurethane, nitrocellulose, and acrylates, all of which may comprise a light diffusing material such as colloidal or fumed silica. See, e.g., U.S. Pat. Nos. 6,939,576, 5,750,054, 5,456,747, 5,415,815, and 5,292,784. Blends and copolymers of these materials can have microscale compositional heterogeneities, which can also exhibit light diffusion behavior to reduce glare.

"Hard coat", or "anti-abrasion layer" refers to a coating that provides additional surface protection against scratches and abrasion. Examples of suitable hard coats include synthetic polymers such as polyacrylics, epoxy, polyurethanes, polysilanes, silicones, poly(silico-acrylic) and so on. Typically, the hard coat also comprises colloidal silica. (See, e.g., U.S. Pat. Nos. 5,958,514, 7,014,918, 6,825,239, and references cited therein.) The thickness of the hard coat is typically from about 1 to 50 µm. The degree of hardness can be evaluated by known methods in the art, such as by scratching the coating with a steel wool #000 reciprocating 50 times within a distance of 2 cm at 2 reciprocations/sec under load of 300 g/cm$^2$ (see, e.g., U.S. Pat. No. 6,905,756). The hard coat may be further exposed to an anti-glare process or an anti-reflection treatment by known methods in the art.

"Adhesive layer" refers to any optically clear material that bonds two adjacent layers (e.g., conductive layer and substrate) together without affecting the physical, electrical or optical properties of either layer. Optically clear adhesive material are well known in the art, including without limitation: acrylic resins, chlorinated olefin resins, resins of vinyl chloride-vinyl acetate copolymer, maleic acid resins, chlorinated rubber resins, cyclorubber resins, polyamide resins, cumarone indene resins, resins of ethylene-vinyl acetate copolymer, polyester resins, urethane resins, styrene resins, polysiloxanes and the like.

"Barrier layer" refers to a layer that reduces or prevents gas or fluid permeation into the transparent conductor. It has been shown that corroded metal nanowires can cause a significant decrease in the electrical conductivity as well as the light transmission of the conductive layer. The barrier layer can effectively inhibit atmospheric corrosive gas from entering the conductive layer and contacting the metal nanowires in the matrix. The barrier layers are well known in the art, including without limitation: see, e.g. U.S. Patent Application No. 2004/0253463, U.S. Pat. Nos. 5,560,998 and 4,927,689, EP Patent No. 132,565, and JP Patent No. 57,061,025. Moreover, any of the anti-reflective layer, anti-glare layer and the hard coat can also act as a barrier layer.

In certain embodiments, the multi-layer transparent conductor may further comprise a protective film above the conductive layer (e.g., layer 22). The protective film is typically flexible and can be made of the same material as the flexible substrate. Examples of protective film include, but are not limited to: polyester, polyethylene terephthalate (PET), polybutylene terephthalate, polymethyl methacrylate (PMMA), acrylic resin, polycarbonate (PC), polystyrene, triacetate (TAC), polyvinyl alcohol, polyvinyl chloride, polyvinylidene chloride, polyethylene, ethylene-vinyl acetate copolymers, polyvinyl butyral, metal ion-crosslinked ethylene-methacrylic acid copolymers, polyurethane, cellophane, polyolefins or the like; particularly preferable is PET, PC, PMMA, or TAC because of their high strength.

Corrosion Inhibitors

In other embodiments, the transparent conductor may comprise a corrosion inhibitor, in addition to, or in lieu of the barrier layer as described above. Different corrosion inhibitors may provide protection to the metal nanowires based on different mechanisms.

According to one mechanism, the corrosion inhibitor binds readily to the metal nanowires, forming a protective film on a metal surface. They are also referred to as barrier-forming corrosion inhibitors.

In one embodiment, the barrier-forming corrosion inhibitor includes certain nitrogen-containing and sulfur-containing organic compounds, such as aromatic triazoles, imida-

SCHEME 1

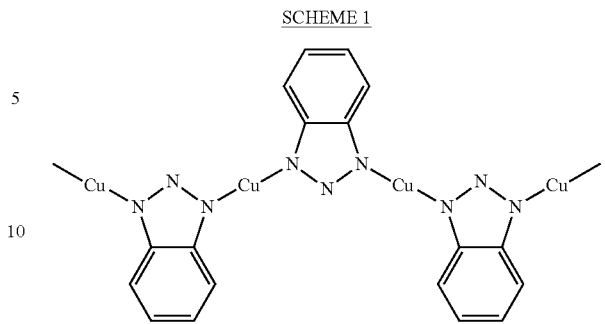

Another class of barrier-forming corrosion inhibitors includes biomolecules that show a particular affinity to the metal surface. These include small biomolecules, e.g. cysteine, and synthetic peptides and protein scaffolds with fused peptide sequences with affinity for metals, e.g. EEEE; see, e.g. U.S. application Ser. Nos. 10/654,623, 10/665,721, 10/965,227, 10/976,179, and 11/280,986, U.S. Provisional Application Ser. Nos. 60/680,491, 60/707,675 and 60/680,491.

Other barrier-forming corrosion inhibitors include dithiothiadiazole, alkyl dithiothiadiazoles and alkylthiols, alkyl being a saturated $C_6$-$C_{24}$ straight hydrocarbon chain. This type of corrosion inhibitor can self-assemble on a metal surface to form a monolayer (Scheme 2), thereby protecting the metal surface from corroding.

SCHEME 2

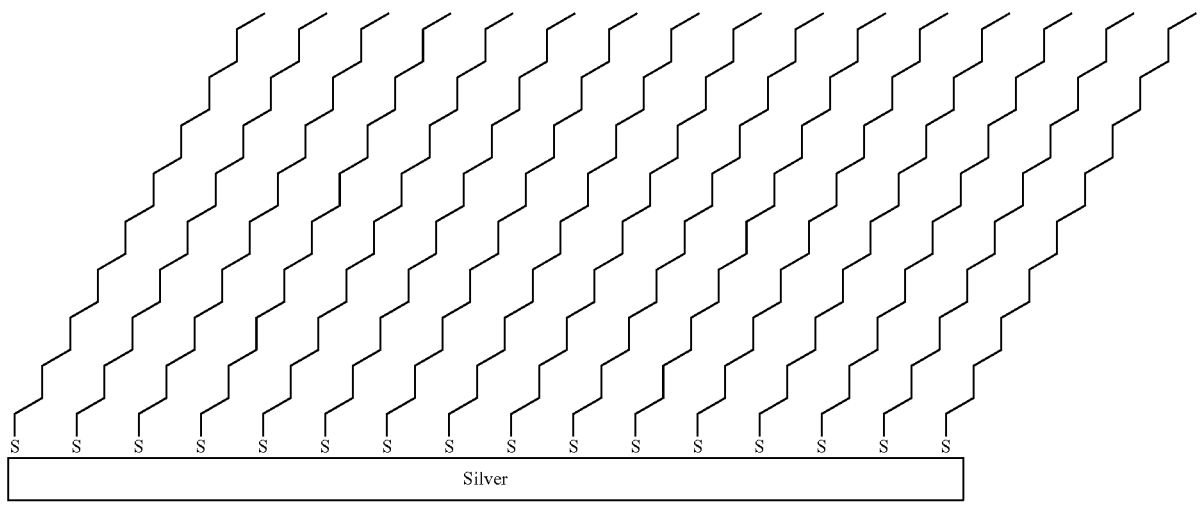

zoles and thiazoles. These compounds have been demonstrated to form stable complexes on a metal surface to provide a barrier between the metal and its environment. For example, benzotriazole (BTA) is a common organic corrosion inhibitor for copper or copper alloys (Scheme 1). Alkyl substituted benzotriazoles, such as tolytriazole and butyl benzyl triazole, can also be used. (See, e.g., U.S. Pat. No. 5,270,364.) Additional suitable examples of corrosion inhibitors include, but are not limited to: 2-aminopyrimidine, 5,6-dimethylbenzimidazole, 2-amino-5-mercapto-1,3,4-thiadiazole, 2-mercaptopyrimidine, 2-mercaptobenzoxazole, 2-mercaptobenzothiazole, and 2-mercaptobenzimidazole.

In a particular embodiment, the transparent conductor can comprise a reservoir containing a corrosion inhibitor, providing a continuous supply of the corrosion inhibitor in the vapor phase. The corrosion inhibitors suitable for such sustained delivery include "vapor phase inhibitors" (VPI). VPIs are typically volatile solid materials that sublime and form a monolayer on the surfaces of the metal nanowires. Advantageously, VPIs can be delivered to the metal surfaces and replenished in a sustained manner for long-lasting protection. Suitable VPIs include barrier-forming inhibitors such as triazoles, dithiothiadiazole, alkyl dithiothiadiazoles and alkylthiols, as described herein.

Figure 12:
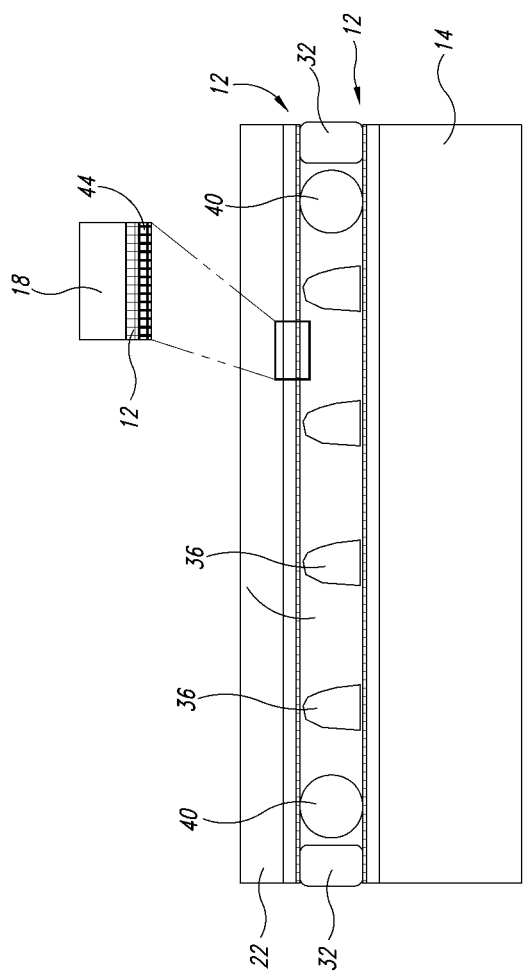
FIG. 12 shows a transparent conductor structure having a reservoir for delivering a vapor phase inhibitor (VPI).

FIG. 12 illustrates such a transparent conductor structure suitable for a touch screen. More specifically, edge seals 32 and spacers 36 are positioned between two conductive layers 12. In the space between the two conductive layers 12, one or more reservoirs 40 are present. The reservoirs 40 are microscopic and are sparsely distributed such that their presence does not cause a reduction in the transmittance of the transparent conductor. The reservoir contains a corrosion inhibitor which can be incorporated into a polymer matrix or impregnated into a porous material from which it can be sublimated into the vapor phase to form a monolayer 44 on the surface of the metal nanowires (see, inset).

According to another mechanism, a corrosion inhibitor binds more readily with a corrosive element (e.g., $H_2S$) than with the metal nanowires. These corrosion inhibitors are known as "scavengers" or "getters", which compete with the metal and sequester the corrosive elements. Examples of $H_2S$ scavengers include, but are not limited to: acrolein, glyoxal, triazine, and n-chlorosuccinimide. (See, e.g., Published U.S. Application No. 2006/0006120.)

In certain embodiments, the corrosion inhibitor (e.g., $H_2S$ scavengers) can be dispersed in the matrix provided its presence does not adversely affect the optical or electrical properties of the conductive layer.

In other embodiments, the metal nanowires can be pre-treated with a corrosion inhibitor before or after being deposited on the substrate. For example, the metal nanowires can be pre-coated with a barrier-forming corrosion inhibitor, e.g., BTA. In addition, the metal nanowires can also be treated with an anti-tarnish solution. Metal anti-tarnish treatments are known in the art. Specific treatments targeting $H_2S$ corrosion are described in, e.g., U.S. Pat. No. 4,083,945, and U.S. Published Application No. 2005/0148480.

In yet other embodiments, the metal nanowires can be alloyed or plated with another metal less prone to corrosion by atmospheric elements. For example, silver nanowires can be plated with gold, which is less susceptible to corroding by $H_2S$.

In certain embodiments, the transparent conductors described herein can be fabricated by various coating methods, including sheet coating and high throughput web coating. In other embodiments, a laminating method can be used. Advantageously, the fabrication processes described herein do not require vacuum deposition, in contrast to the current fabrication of the metal oxide films. Instead, the fabrication processes can be carried out using conventional solution-processing equipment. Moreover, the fabrication processes are compatible with directly patterning the transparent conductor.

Nanowire Deposition and Transparent Conductor Fabrication

In certain embodiments, it is thus described herein a method of fabricating a transparent conductor comprising: depositing a plurality of metal nanowires on a substrate, the metal nanowires being dispersed in a fluid; and forming a metal nanowire network layer on the substrate by allowing the fluid to dry.

The metal nanowires can be prepared as described above. The metal nanowires are typically dispersed in a liquid to faciliate the deposition. It is understood that, as used herein, "deposition" and "coating" are used interchangeably. Any non-corrosive liquid in which the metal nanowires can form a stable dispersion (also called "metal nanowires dispersion") can be used. Preferably, the metal nanowires are dispersed in water, an alcohol, a ketone, ethers, hydrocarbons or an aromatic solvent (benzene, toluene, xylene, etc.).

More preferably, the liquid is volatile, having a boiling point of no more than 200° C., no more than 150° C., or no more than 100° C.

In addition, the metal nanowire dispersion may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., ZONYL® by DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents include water and isopropanol.

If it is desired to change the concentration of the dispersion from that disclosed above, the percent of the solvent can be increased or decreased. In preferred embodiments the relative ratios of the other ingredients, however, can remain the same. In particular, the ratio of the surfactant to the viscosity modifier is preferably in the range of about 80 to about 0.01; the ratio of the viscosity modifier to the metal nanowires is preferably in the range of about 5 to about 0.000625; and the ratio of the metal nanowires to the surfactant is preferably in the range of about 560 to about 5. The ratios of components of the dispersion may be modified depending on the substrate and the method of application used. The preferred viscosity range for the nanowire dispersion is between about 1 and 100 cP.

Optionally, the substrate can be pre-treated to prepare a surface to better receive the subsequent deposition of the nanowires. Surface pre-treatments serve multiple functions. For example, they enable the deposition of a uniform nanowire dispersion layer. In addition, they can immobilize the nanowires on the substrate for subsequent processing steps. Moreover, the pre-treatment can be carried out in conjunction with a patterning step to create patterned deposition of the nanowires. As will be discussed further in more detail below, pre-treatments include solvent or chemical washing, heating, deposition of an optionally patterned intermediate layer to present an appropriate chemical or ionic state to the nanowire dispersion, as well as further surface treatments such as plasma treatment, UV-ozone treatment, or corona discharge.

Following the deposition, the liquid is removed by evaporation. The evaporation can be accelerated by heating (e.g., baking). The resulting nanowire network layer may require post-treatment to render it electrically conductive. This post-treatment can be a process step involving exposure to heat, plasma, corona discharge, UV-ozone, or pressure as described below.

In certain embodiments, it is thus described herein a method of fabricating a transparent conductor comprising:

depositing a plurality of metal nanowires on a substrate, the metal nanowires being dispersed in a fluid; forming a metal nanowire network layer on the substrate by allowing the fluid to dry, coating a matrix material on the metal nanowire network layer, and curing the matrix material to form a matrix.

"Matrix material" refers to a material or a mixture of materials that can cure into the matrix, as defined herein. "Cure", or "curing", refers to a process where monomers or partial polymers (fewer than 150 monomers) polymerize and/or cross-link so as to form a solid polymeric matrix. Suitable polymerization conditions are well known in the art and include by way of example, heating the monomer, irradiating the monomer with visible or ultraviolet (UV) light, electron beams, and the like. In addition, "solidification" of a polymer/solvent system simultaneously caused by solvent removal is also within the meaning of "curing".

In certain embodiments, the matrix material comprises a polymer. Optically clear polymers are known in the art. Examples of suitable polymeric matrices include, but are not limited to: polyacrylics such as polymethacrylates, polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the matrix material comprises a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In a preferred embodiment, the prepolymer is photocurable, i.e., the prepolymer polymerizes and/or cross-links upon exposure to irradiation. As will be described in more detail, matrices based on photo-curable prepolymers can be patterned by exposure to irradiation in selective regions. In other embodiments, the prepolymer is thermal-curable, which can be patterned by selective exposure to a heat source.

Typically, the matrix material is a liquid. The matrix material may optionally comprise a solvent. Any non-corrosive solvent that can effectively solvate or disperse the matrix material can be used. Examples of suitable solvents include water, an alcohol, a ketone, tetrahydrofuran, hydrocarbons (e.g. cyclohexane) or an aromatic solvent (benzene, toluene, xylene, etc.). More preferably, the solvent is volatile, having a boiling point of no more than 200° C., no more than 150° C., or no more than 100° C.

In certain embodiments, the matrix material may comprise a cross-linker, a polymerization initiator, stabilizers (including, for example, antioxidants, and UV stabilizers for longer product lifetime and polymerization inhibitors for greater shelf-life), surfactants and the like. In other embodiments, the matrix material may further comprise a corrosion inhibitor.

As noted herein, the transparent conductors can be fabricated by, for example, sheet coating, web-coating, printing, and lamination.

(a) Sheet Coating

Sheet coating is suitable for coating a conductive layer on any substrate, in particular, rigid substrates.

Figure 13A:
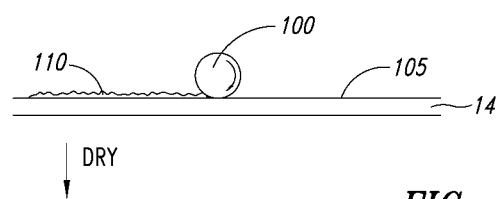
FIGS. 13A-13D show an example of a fabrication process of a transparent conductor.
Figure 13B:
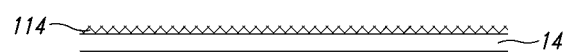

FIGS. 13A-13B show an embodiment of the fabrication of the transparent conductor by sheet coating. A metal nanowires dispersion (not shown) can be initially deposited to the substrate 14. A roller 100 can be rolled across a top surface 105 of the substrate 14, leaving a metal nanowires dispersion layer 110 on the top surface 105 (FIG. 13A). The layer 110 is allowed to dry and a metal nanowire network layer 114 is formed on the surface 105 (FIG. 13B).

The substrate may require a pre-treatment to enable the deposition of a uniform nanowire dispersion layer 110 that adheres to the substrate for subsequent processing steps. This treatment can include solvent or chemical washing, heating, deposition of an optionally patterned intermediate layer to present an appropriate chemical or ionic state to the nanowire dispersion, as well as further surface treatments such as plasma treatment, UV-ozone treatment, or corona discharge.

For example, an intermediate layer can be deposited on the surface of the substrate to immobilize the nanowires. The intermediate layer functionalizes and modifies the surface to facilitate the binding of the nanowires to the substrate. In certain embodiments, the intermediate layer can be coated on the substrate prior to depositing the nanowires. In other embodiments, the intermediate layer can be co-deposited with the nanowires.

In certain embodiments, multifunctional biomolecules such as polypeptides can be used as the intermediate layer. Polypeptide refers to a polymeric sequence of amino acids (monomers) joined by peptide (amide) bonds. The amino acid monomers in a polypeptide can be the same or different. Amino acids having side chain functionalities (e.g., amino or carboxylic acid groups) are preferred. Examples of suitable polypeptides thus include poly-L-lysine, poly-L-glutamic acid and the like. The polypeptide can be coated on the substrate prior to the nanowire deposition. Alternatively, the polypeptide can be co-deposited on the substrate with the nanowire dispersion. Many substrates, including glass, polyester substrates (e.g., polyethylene terephthalate) exhibit affinities for polypeptides.

Advantageously, the intermediate layer can be deposited in a pre-determined pattern, which enables the deposition of the nanowires according to the same pattern.

Other pre-treatment methods can also be carried out in conjunction with a patterning step in order to perform patterned depositions. For example, plasma surface treatment can be carried out through an aperture mask having a desired pattern. The surface of the substrate therefore comprises at least one pre-treated regions and at least one untreated region. Nanowires deposited on the pre-treated region adhere to the substrate better than they adhere to the untreated region. Accordingly, a patterned deposition can be achieved by removing the nanowires on the untreated region by, e.g., washing.

It should be understood that the pre-treatments described above also apply to other methods of fabricating transparent conductors in accordance with the description below.

The nanowire network layer formed may further require a post-treatment to render it electrically conductive. This post-treatment can be a process step involving exposure to heat, plasma, corona discharge, UV-ozone, or pressure, as will be discussed in more detail below.

Figure 13C:
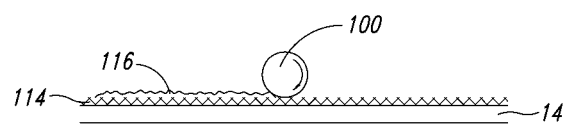
Figure 13D:
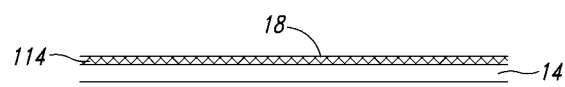

In some embodiments, a matrix material can be coated on the nanowire network layer 114 to form a matrix material layer 116 (FIG. 13C). As shown in FIG. 13D, the matrix material layer 116 is allowed to cure to obtain a matrix and the structures of FIGS. 10A-10E, can be obtained.

It is understood that a brush, a stamp, a spray applicator, a slot-die applicator or any other suitable applicator can be used in the place of the roller 100. Additionally, as discussed further below, reverse and forward gravure printing, slot die coating, reverse and forward bead coating and draw down table can also be used to deposit nanowires onto a substrate. Advantageously, a roller or stamp having recesses of a predetermined pattern can be used to coat a patterned metal nanowires dispersion layer, or matrix material layer, thus printing a patterned conductive layer (e.g., Gravure printing). The conductive layer can also be patterned by spraying the nanowire or matrix formulation onto the substrate through an aperture mask. If the matrix material layer is deposited or cured in a patterned layer, the pattern can be transferred into the metal nanowire layer by removing sufficient numbers of them to drop the concentration of nanowires below the percolation threshold. Nanowires can be removed by washing or brushing them away with a suitable solvent or by transferring them to a tacky or adhesive roller.

It is further understood that additional depositions or coatings can be carried out, while allowing for drying or curing between two consecutive coating step. For example, any number of the performance-enhancing layers can be coated in the same manner as described above.

(b) Web Coating

Web-coating has been employed in the textile and paper industries for high-speed (high-throughput) coating applications. It is compatible with the deposition (coating) processes for transparent conductor fabrication. Advantageously, web-coating uses conventional equipment and can be fully automated, which dramatically reduces the cost of fabricating transparent conductors. In particular, web-coating produces uniform and reproducible conductive layers on flexible substrates. Process steps can be run on a fully integrated line or serially as separate operations.

Figure 14A:
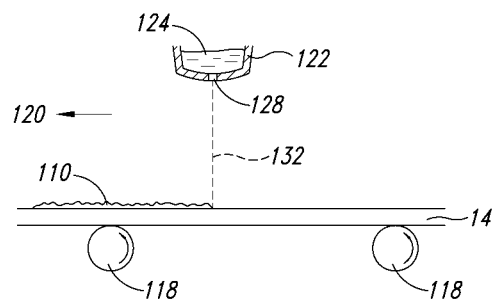
FIG. 14A shows an example of a fabrication process of a transparent conductor by web coating.

FIG. 14A shows an embodiment in which a flexible substrate in the form of a film or web can be coated continuously along a moving path. More specifically, a substrate 14 mounted on reels 118 is drawn by a motor (not shown) and moves along a travelling path 120. The substrate can be fed to the reels directly or via a conveyor belt system (not shown). A storage tank 122 is positioned above the substrate 14. The storage tank 122 contains a metal nanowires dispersion 124 for metal nanowires deposition. An aperture 128 in the storage tank 122 delivers a continuous stream of metal nanowire dispersion 132 on the substrate 14 to form a layer 110 on a top surface 105 of the substrate 14.

It is understood that the matrix material is stored in another storage tank (not shown), and the matrix material can be coated in the same manner as described above.

It is further understood that any dispensing device can be used in the place of the storage tank, including a spraying device (e.g., an atomizer that delivers pressurized dispersions), a brushing device, a pouring device and the like. Like the sheet coating, a printing device can also be used to provide patterned coatings.

Figure 14B:
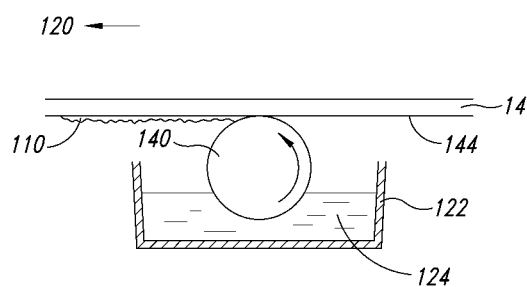
FIG. 14B shows another example of a fabrication process of a transparent conductor by web coating.

FIG. 14B shows an alternative method of web-coating in which the coating is carried out on a bottom surface of a substrate. Like the method illustrated in FIG. 14A, a substrate 14 moves along a traveling path 120. A coating roller 140 is positioned below the substrate and partially submerged in a metal nanowire dispersion 124 stored in a storage tank 122. The coating roller 140 delivers a metal nanowire dispersion layer 110 on a bottom surface 144 of the substrate 14. Coating roller 140 can rotate in the direction of the traveling path 120 or in the opposite direction. The coating of the matrix material can be carried out in the same manner.

In the processes described in FIGS. 14A and 14B, it is noted that various surface treatments can be applied prior to or after each deposition step. As will be described in more detail below, surface treatments can enhance the transparency and/or conductivity of the conductive layers formed. Suitable surface treatments include, but are not limited to solvent or chemical washing, plasma treatments, Corona discharge, UV/ozone treatment, pressure treatment and combinations thereof.

Figure 15A:
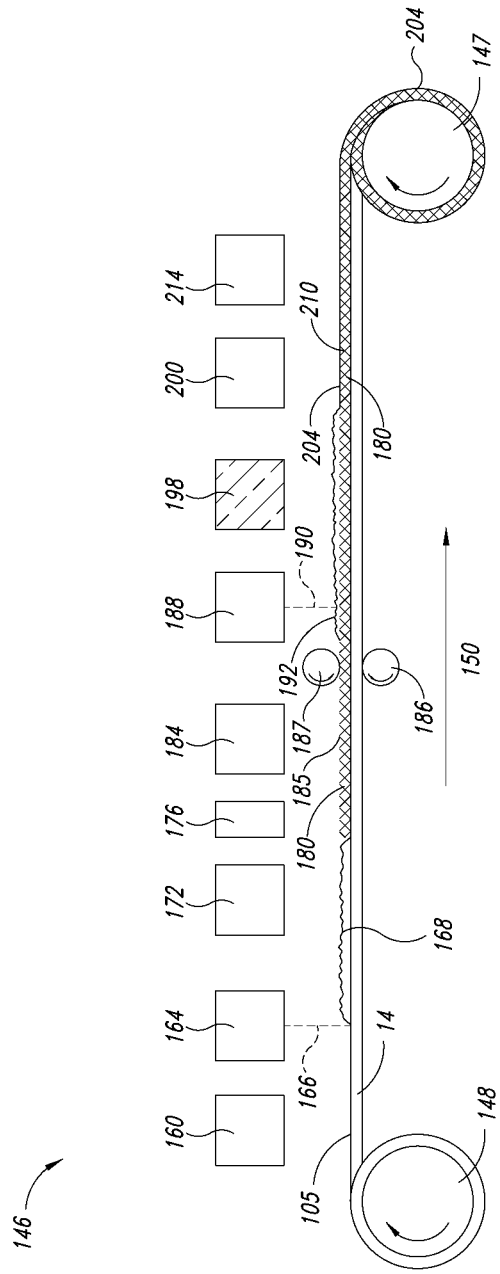
FIG. 15A shows a web coating system and a flow process for fabricating a transparent conductor.
Figure 15D:
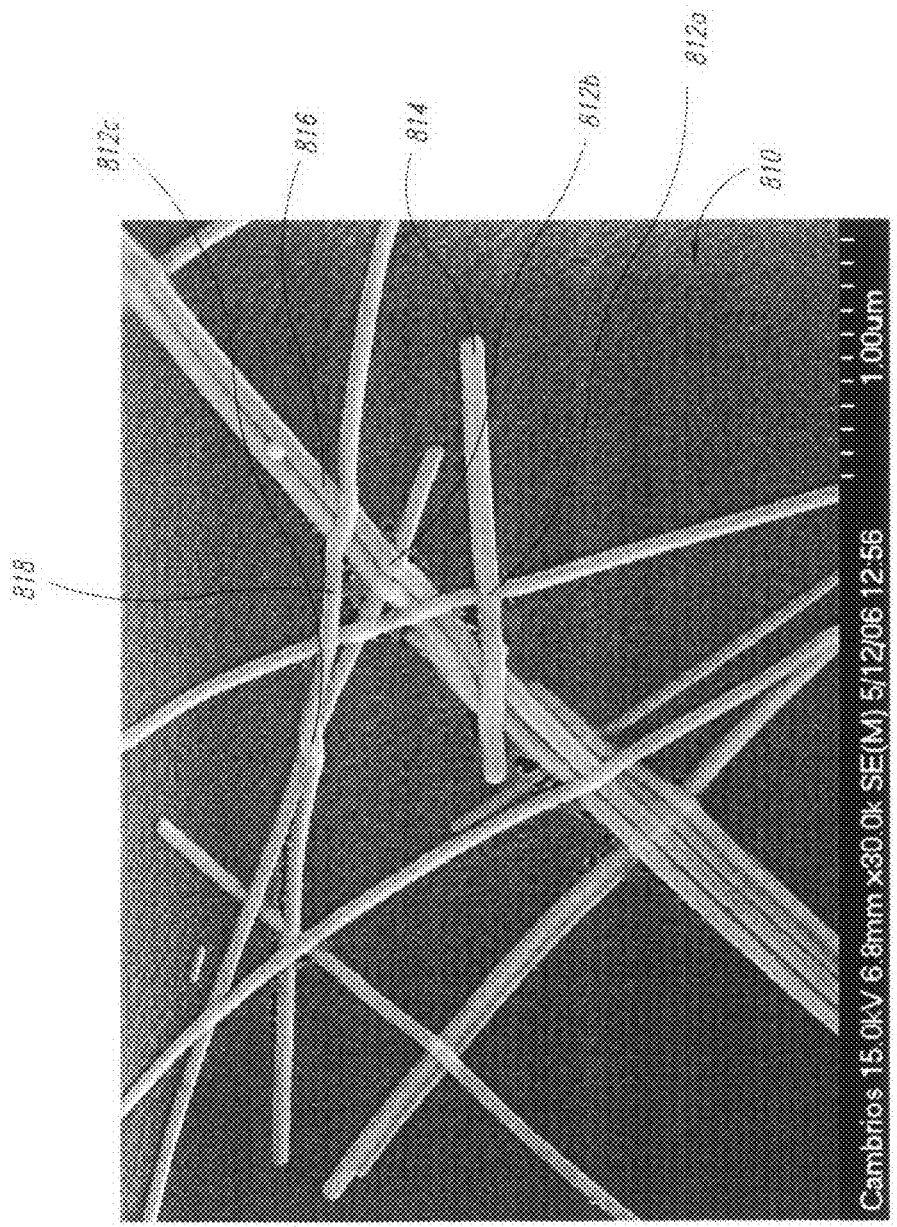
FIG. 15B shows an SEM image of a conductive layer following a post-treatment of pressure application.

FIG. 15A shows a comprehensive process flow for fabricating a transparent conductor. As shown, a web-coating system 146 includes a take-up reel 147 that is driven by a motor (not shown). The take up reel 147 draws a substrate 14 (e.g., a flexible polymer film) from a supply reel 148 along a traveling path 150. The substrate 14 is then subjected to sequential treatments and coating processes along the traveling path 150. It will become apparent to one skilled in the art that the speed of the reel, the speed of deposition, the concentration of the matrix material, and the adequacy of the drying and curing processes are among the factors that determine the uniformity and the thickness of the conductive layer formed.

Moreover, in certain embodiments, pre-treatments are conducted to prepare the substrate for the subsequent coating processes. More specifically, the substrate 14 can be optionally surface-treated at a pre-treatment station 160 to improve the efficiency of the subsequent nanowire deposition. In addition, surface treatment of the substrate prior to the deposition can enhance the uniformity of the nanowires later deposited.

The surface treatment can be carried out by known methods in the art. For example, plasma surface treatment can be used to modify the molecular structure of the surface of the substrate. Using gases such as argon, oxygen or nitrogen, plasma surface treatment can create highly reactive species at low temperatures. Typically, only a few atomic layers on the surface are involved in the process, so the bulk properties of the substrate (e.g. the polymer film) remain unaltered by the chemistry. In many instances, plasma surface treatment provides adequate surface activation for enhanced wetting and adhesive bonding. As an illustrative example, oxygen plasma treatment can be carried out in a March PX250 system, using the following operating parameters: 150 W, 30 sec, $O_2$ flow: 62.5 sccm, pressure: ~400 mTorr.

In other embodiments, the surface treatment may include depositing an intermediate layer on the substrate. As noted above, the intermediate layer typically exhibits affinities for both the nanowires and the substrate. Thus, the intermediate layer is capable of immobilizing the nanowires and causing the nanowires to adhere to the substrate. Representative materials suitable as the intermediate layer include multifunctional biomolecules, including polypeptides (e.g., poly-L-lysine.)

Other exemplary surface treatments include surface washing with a solvent, Corona discharge and UV/ozone treatment, all of which are known to one skilled in the art.

The substrate 14 thereafter proceeds to a metal nanowires deposition station 164, which delivers a metal nanowires dispersion 166, as defined herein. The deposition station can be a storage tank as described in FIG. 14A, a spraying device, a brushing device, and the like. A metal nanowires dispersion layer 168 is deposited on the surface 105. Alternatively, a printing device can be used to apply a patterned coating of the metal nanowires dispersion on the substrate. For example, a stamp or roller having recesses of a predetermined pattern can be used. The stamp or roller can be continuously dipped into a metal nanowires dispersion by known methods in the art.

The layer 168 can be optionally rinsed at a rinsing station 172. Thereafter, the layer 168 is dried at a drying station 176 to form a metal nanowire network layer 180.

Optionally, the network layer 180 can be treated at a post-treatment station 184. For example, surface treatment of the metal nanowires with argon or oxygen plasma can improve the transparency and the conductivity of the network layer 180. As an illustrative example, Ar or $N_2$ plasma can be carried out in a March PX250 system, using the following operating parameters: 300 W, 90 sec (or 45 sec), Ar or $N_2$ gas flow: 12 sccm, pressure ~300 mTorr. Other known surface treatments, e.g., Corona discharge or UV/ozone treatment, may also be used. For example, the Enercon system can be used for a Corona treatment.

As a part of the post-treatment, the network layer can further be pressure treated. More specifically, the network layer 180 is fed through rollers 186 and 187, which apply pressure to the surface 185 of the network layer 180. It should be understood that a single roller could also be used.

Advantageously, the application of pressure to a metal nanowire network fabricated in accordance with a method described herein can increase the conductivity of the conducting layer.

In particular, pressure may be applied to one or both surfaces of a conducting sheet transparent conductor fabricated in accordance with a method described herein by use of one or more rollers (e.g., cylindrical bars), one or both of which may, but need not, have a length dimension larger than a width dimension of the conducting layer. If a single roller is used, the network layer may be placed on a rigid surface and the single roller rolled across the exposed surface of the conducting layer using known methods while pressure is applied to the roller. If two rollers are used, the network layer may be rolled between the two rollers as shown in FIG. 15A.

In one embodiment, from 50 to 10,000 psi may be applied to the transparent conductor by one or more rollers. It is also considered that from 100 to 1000 psi, 200 to 800 psi or 300 to 500 psi may be applied. Preferably, pressure is applied to a transparent conductor prior to the application of any matrix material.

"Nip" or "pinch" rollers may be used if two or more rollers are used to apply pressure to the conducting sheet. Nip or pinch rollers are well understood in the art and discussed in, for example, 3M Technical Bulletin "Lamination Techniques for Converters of Laminating Adhesives," March, 2004, which is hereby incorporated by reference in its entirety.

It was determined that application of pressure to a metal nanowire network layer improved the conductivity thereof either before or after application of a plasma treatment as discussed above, and may be done with or without a previous or subsequent plasma treatment. As shown in FIG. 15A, the rollers 186 an 187 may be rolled across the surface 185 of the network layer 180 a single or multiple times. If the rollers are rolled across the network layer 180 multiple times, the rolling may be carried out in the same direction with respect to an axis parallel to the rolled surface of the sheet (e.g., along the traveling path 150) or in different directions (not shown).

FIG. 15B is an SEM image of a portion of a metal nanowire conductive network 810 after application of from about 1000 psi to about 2000 psi using a stainless steel roller. Conductive network 810 includes a plurality of nanowire crossing points such as crossing points 812a, 812b and 812c. As shown, at least the top nanowires 814, 816, and 818 at each of crossing points 812a, 812b and 812c have flattened cross sections where the intersecting wires have been pressed into each other by the application of pressure, thereby enhancing the connectivity as well as the conductivity of the nanowire conductive network.

The application of heat may also be used at this point as a post-treatment. Typically, the transparent conductor exposed to anywhere from 80° C. to 250° C. for up to 10 min, and more preferably is exposed to anywhere from 100° C. to 160° C. for anywhere from about 10 seconds to 2 minutes. The transparent conductor can also be exposed to temperatures higher than 250° C. and can be as high as 400° C., depending on the type of substrate. For example, glass substrate can be heat-treated at a temperature range of about 350° C. to 400° C. However, post treatments at higher temperatures (e.g., higher than 250° C.) may require the presence of a non-oxidative atmosphere, such as nitrogen or a noble gas.

The heating can be carried out either on-line or off-line. For example, in an off-line treatment, the transparent conductor can be placed in a sheet drying oven set at a given temperature for a predetermined amount of time. Heating a transparent conductor in such a way can improve the conductivity of a transparent conductor fabricated as described herein. For example, a transparent conductor fabricated using a reel-to-reel process as described herein was placed in a sheet drying oven set at a temperature of 200° C. for 30 seconds. Before this heat post-treatment, the transparent conductor had a surface resistivity of about 12 kΩ/□, which dropped to about 58Ω/□ after the post-treatment.

In another example, a second, similarly prepared transparent conductor was heated in a sheet oven at 100° C. for 30 seconds. The resistivity of the second transparent conductor dropped from about 19 kΩ/□ to about 400Ω/□. It is also considered that the transparent conductor may be heated using methods other than a sheet oven. For example, an infrared lamp could be used as either an in-line or off-line method to heat the transparent conductor. RF currents may also be used to heat the metal nanowire network. RF currents may be induced in a metal nanowire network by either broadcast microwaves or currents induced through electrical contacts to the nanowire network.

Additionally, a post-treatment that applies both heat and pressure to the transparent conductor can be used. In particular, to apply pressure, the transparent conductor can be placed through one or more rollers as described above. To simultaneously apply heat, the rollers may be heated. The pressure applied by the rollers is preferably from 10 to 500 psi and more preferably from 40 to 200 psi. Preferably, the rollers are heated to between about 70° C. and 200° C. and more preferably to between about 100° C. and 175° C. Such application of heat in combination with pressure can improve the conductivity of a transparent conductor. A machine which may be used to apply both appropriate pressure and heat simultaneously is a laminator by Banner American Products of Temecula, Calif. Application of heat in combination with pressure can be done either before or after deposition and curing of a matrix or other layers as described below.

Another post-treatment technique that can be used to increase conductivity of a transparent conductor is to expose the metal wire conductive network of a transparent conductor fabricated as disclosed herein to a metal reducing agent. In particular, a silver nanowire conductive network can preferably be exposed to a silver reducing agent such as sodium borohydride for, preferably, anywhere from about 10 seconds to about 30 minutes, and more preferably from about 1 minute to about 10 minutes. As would be understood by one of ordinary skill in the art, such exposure can be done either in-line or off-line.

As noted above, such a treatment can increase the conductivity of a transparent conductor. For example, a transparent conductor of silver nanowires on a substrate of PET and prepared according to a reel-to-reel method disclosed herein was exposed to 2% $NaBH_4$ for 1 minute, which was then rinsed in water and dried in air. Before this post-treatment the transparent conductor had a resistivity of about 134Ω/□ and after this post-treatment, the transparent conductor had a resistivity of about 9Ω/□. In another example, a transparent conductor of silver nanowires on a glass substrate was exposed to 2% $NaBH_4$ for 7 minutes, rinsed in water and air dried. Before this post-treatment the transparent conductor had a resistivity of about 3.3 MΩ/□0 and after this post-treatment, the transparent conductor had a resistivity of about 150Ω/□. Reducing agents other than sodium borohydride can be used for this post treatment. Other suitable reducing agents include other borohydrides such as sodium borohydride; boron nitrogen compounds such as dimethyl aminoborane (DMAB); and gas reducing agents, such as hydrogen gas ($H_2$).

Thereafter, the substrate 14 proceeds to a matrix deposition station 188, which delivers a matrix material 190, as defined herein. The matrix deposition station 188 can be a storage tank as described in FIG. 14A, a spraying device, a brushing device, a printing device and the like. A layer of the matrix material 192 is thus deposited on the network layer 180. Advantageously, the matrix material can be deposited by a printing device to form a patterned layer.

The layer 192 is then allowed to cure at a curing station 200. Where the matrix material is a polymer/solvent system, the layer 192 can be cured by allowing the solvent to evaporate. The curing process can be accelerated by heating (e.g., baking). When the matrix material comprises a radiation-curable prepolymer, the layer 192 can be cured by irradiation. Depending on the type of the prepolymer, thermal curing (thermally induced polymerization) can also be used.

Optionally, a patterning step can be carried out before the layer of the matrix material 192 is cured. A patterning station 198 can be positioned after the matrix deposition station 188 and before the curing station 200. The patterning step will be discussed in more detail below.

The curing process forms a conductive layer 204 comprising the metal nanowires network layer 180 in a matrix 210. The conductive layer 204 can be further treated at a post-treatment station 214.

In one embodiment, the conductive layer 204 can be surface treated at the post-treatment station 214 to expose a portion of the metal nanowires on the surface of the conductive layer. For example, a minute amount of the matrix can be etched away by solvent, plasma treatment, Corona discharge or UV/ozone treatments. Exposed metal nanowires are particularly useful for touch screen applications.

In another embodiment, a portion of the metal nanowires is exposed on the surface of the conductive layer 204 following the curing process (see, also, FIGS. 10C and 10D), and an etching step is not needed. In particular, when the thickness of the matrix material layer 192 and surface tension of the matrix formulation are controlled appropriately, the matrix will not wet the top portion of the metal nanowire network and a portion of the metal nanowires will be exposed on the surface of the conductive layer.

The conductive layer 204 and the substrate 14 are then drawn up by the take-up reel 147. This flow process of fabrication is also referred to as a "reel-to-reel" or "roll-to-roll" process. Optionally, the substrate can be stabilized by traveling along a conveyor belt.

In the "reel-to-reel" process, multiple coating steps can be carried out along the traveling path of a moving substrate. The web coating system 146 therefore can be customized or otherwise adapted to incorporate any number of additional coating stations as needed. For example, coatings of the performance-enhancing layers (anti-reflective, adhesive, barrier, anti-glare, protective layers or films) can be fully integrated into the flow process.

Advantageously, the reel-to-reel process is capable of producing uniform transparent conductors at high-speed and low cost. In particular, due to the continuous flow of the coating process, the coated layers do not have trailing edges.

(c) Lamination

Despite its versatility, the "reel-to-reel" process is not compatible with a rigid substrate, such as glass. While rigid substrates can be coated by sheet coating and can possibly be carried on a conveyor belt, they typically experience edge defects and/or lack of uniformity. In addition, sheet coating is a lower throughput process, which can significantly increase the cost of production.

Thus, it is described herein a lamination process for fabricating a transparent conductor through the use of a flexible donor substrate. This process is compatible with both rigid substrates and flexible substrates. More specifically, the lamination process comprises: coating a conductive layer on a flexible donor substrate, the conductive layer including a plurality of metal nanowires which can be embedded in a matrix; separating the conductive layer from the flexible donor substrate; and transferring the conductive layer to a substrate of choice. Advantageously, the coating steps onto the flexible donor substrate can be carried out by a reel-to-reel process because the donor substrate is flexible. The conductive layer formed thereof can then be transferred to a substrate of choice, which can be rigid or flexible, through standard lamination processes. If only nanowires are deposited onto the flexible donor substrate and no matrix material is used, a lamination adhesive may be used to attach the conductive layer to the substrate of choice.

"Flexible donor substrate" refers to a flexible substrate in the form of a sheet, film, web, and the like. The flexible donor substrate is not particularly limited so long as it can be separated from the conductive layer. The flexible donor substrate can be any of the flexible substrates as described herein. In addition, the flexible donor substrate can be woven or non-woven textile, paper, and the like. The flexible donor substrate need not be optically clear.

In certain embodiments, the flexible donor substrate can be pre-coated with a release layer prior to the coating of the conductive layer. "Release layer" refers to a thin layer adhered to the donor substrate and onto which a conductive layer can be formed by web coating. The release layer must allow for an easy removal of the donor substrate from the conductive layer without damaging the conductive layer. Typically, the release layer is formed of a material having low surface energy, including but not limited to: silicon based polymers, fluorinated polymers, starch, and the like.

Figure 16A:
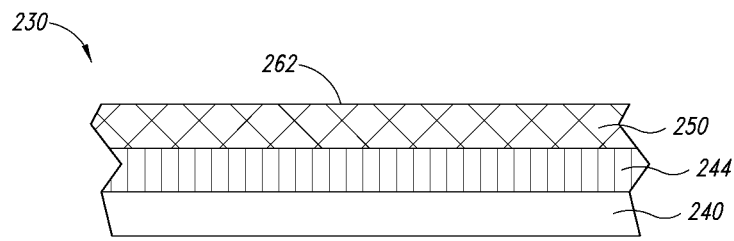
FIGS. 16A-16C show an example of a lamination process.

FIG. 16A illustrates an example of a laminated structure 230 comprising, a flexible donor substrate 240, a release layer 244 coated on the flexible donor substrate 240, and a conductive layer 250 coated on the release layer 244.

The laminated structure 230 can be fabricated in the same manner as described in connection with FIG. 15A, using the flexible donor substrate. Prior to the metal nanowire deposition, the release layer 244 is deposited or coated on the flexible donor substrate. The conductive layer 250 can be formed by metal nanowires deposition followed by matrix deposition, as described herein.

Figure 16B:
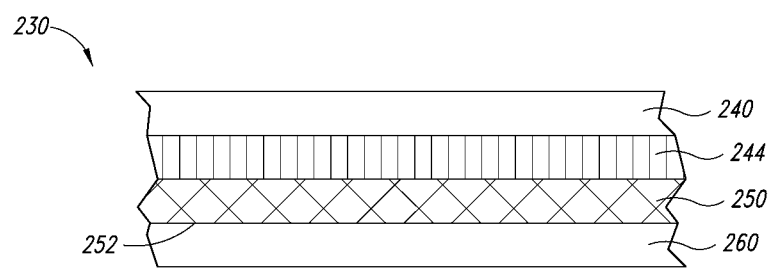
Figure 16C:
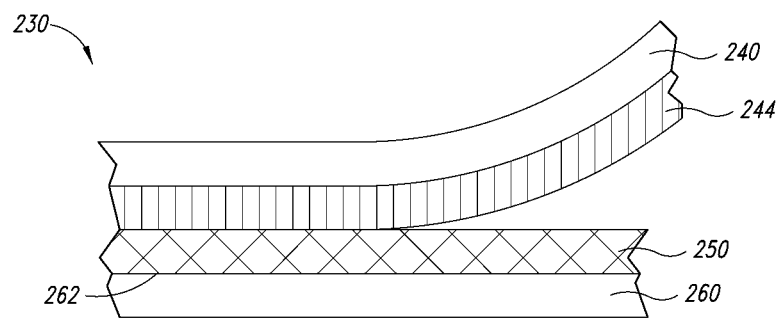

The conductive layer is then uniformly transferred to a substrate of choice. In particular, a rigid substrate (e.g., glass), which is typically not adaptable to the reel-to-reel coating process, can be laminated with the conductive layer. As shown in FIG. 16B, the laminated structure 230 is transferred to a substrate 260 (e.g., glass) by contacting a surface 262 of the conductive layer 250 to the substrate 260. In certain embodiments, the polymeric matrix (e.g., PET, PU, polyacrylates) provides adequate adhesion to the substrate 260. Thereafter, as shown in FIG. 16C, the flexible donor substrate 240 can be removed by detaching the release layer 244 from the conductive layer 250.

Figure 17A:
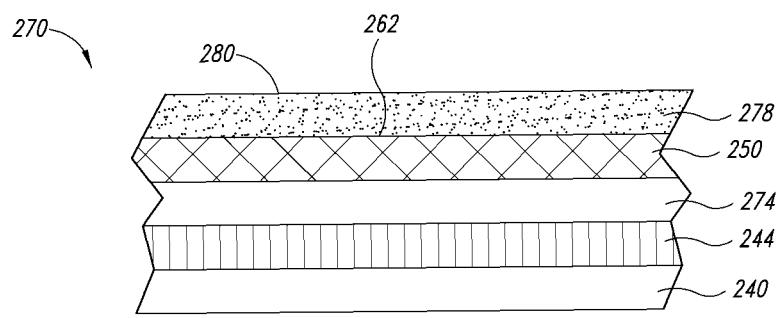
FIGS. 17A-17C show another example of a lamination process.

In other embodiments, an adhesive layer can be used to provide a better bonding between the conductive layer and the substrate during the lamination step. FIG. 17A shows a laminated structure 270 comprising, in addition to the flexible donor substrate 240, the release layer 244 and the conductive layer 250, an overcoat 274 and an adhesive layer 278. The adhesive layer 278 has an adhesive surface 280.

The laminated structure 270 can be fabricated by a reel-to-reel process as described in connection with FIG. 15A, with the understanding that the web coating system 146 is adapted to provide additional stations for coating the adhesive layer and the overcoat. The adhesive layer is as defined herein (e.g., polyacrylates, polysiloxanes), and can be pressure sensitive, hot-melted, radiation-curable, and/or thermally curable. The overcoat can be one or more of the performance-enhancing layers, including a hard coat, an anti-reflective layer, an protective film, a barrier layer, and the like.

Figure 17B:
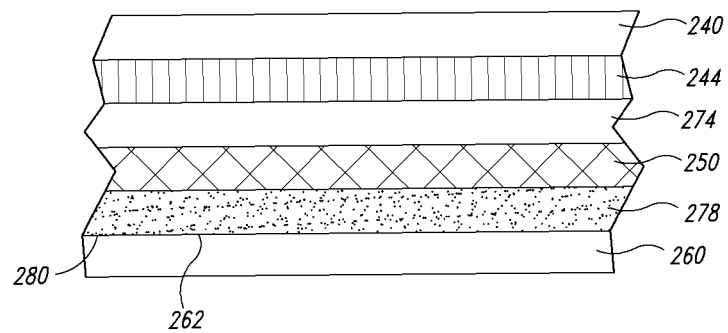
Figure 17C:
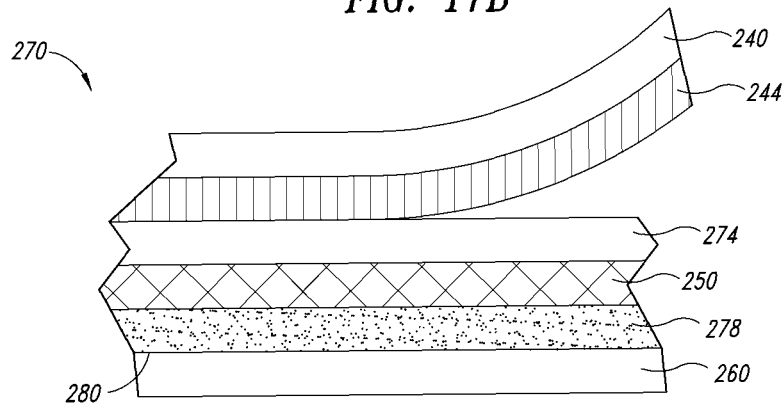

In FIG. 17B, the laminated structure 270 is bonded with the substrate 260 via the adhesive surface 280. Thereafter, as shown in FIG. 17C, the flexible donor substrate 240 is removed by detaching the release layer 244 from the overcoat 274.

In certain embodiments, heat or pressure can be used during the lamination process to enhance the bonding between the adhesive layer (or the conductive layer in the absence of an adhesive layer) and the substrate.

In other embodiments, a release layer is not necessary due to an affinity differential of the conductive layer with respect to the flexible donor substrate and the substrate of choice. For example, the conductive layer may have a much higher affinity to glass than to a textile donor substrate. After the lamination process, the textile donor substrate can be removed while the conductive layer is firmly bonded with the glass substrate.

In certain embodiments, a patterned transfer is possible during the lamination process. For example, the substrate can be heated by a thermal gradient, which affords heated regions and unheated regions on the substrate according to a predetermined pattern. Only the heated regions will be laminated with the conductive layer due to an enhanced affinity (e.g., adhesion), therefore providing a patterned conductive layer on the substrate. Heated regions on a substrate can be generated, for example, by a nichrome wire heater positioned beneath the areas of a substrate to be heated.

In other embodiments, a patterned transfer can be affected by a pressure gradient based on a pressure-sensitive affinity displayed by certain matrix materials or adhesives. For example, a patterned laminating roller can be used to apply different pressures according to a predetermined pattern. The patterned laminating roller can also be heated to further the affinity differential between pressured region and unpressured region.

In yet other embodiments, the conductive layer can be pre-cut (e.g., die cut) according to a predetermined pattern, prior to the lamination process. After transferring the pre-cut conductive layer to the substrate, the conductive layer of the predetermined pattern is retained while the rest is removed along a pre-cut contour.

Patterning

Figure 18:
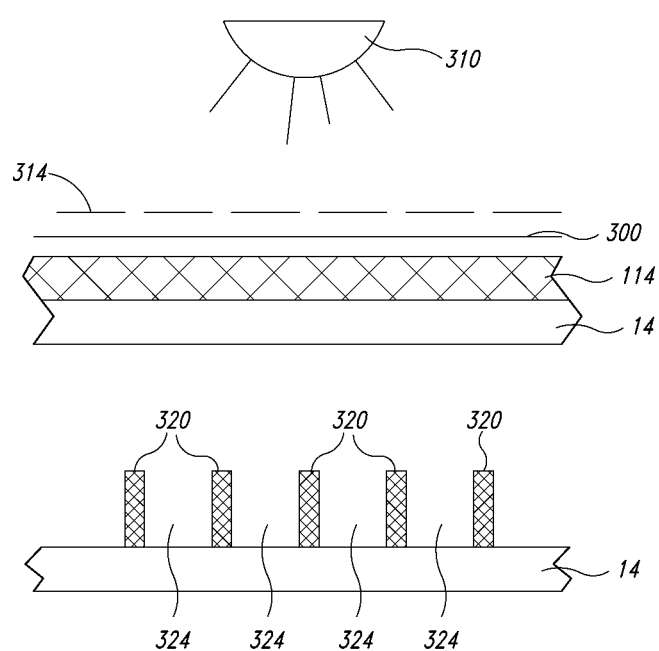
FIG. 18 shows an example of photo-patterning a conductive layer.

As noted above, a patterned conductive layer can be formed by selectively curing a prepolymer coating according to a pattern. The curing process can be carried out photolytically or thermally. FIG. 18 illustrates an embodiment in which a conductive layer is photo-patterned. More specifically, the metal nanowire network layer 114 is deposited on the substrate 14 according to a method described herein (e.g., FIGS. 13A-13D). It should be understood that the substrate 14 can be any substrate, including a flexible donor substrate.

Thereafter, a prepolymer coating 300 is deposited on the network layer of metal nanowires 114. An irradiation source 310 provides the photon energy for curing the prepolymer coating. A mask 314 is positioned between the prepolymer coating 300 and the irradiation source 310. Upon exposure, only regions exposed to the irradiation are cured (i.e., regions 320); the prepolymer coating and nanowires in the uncured regions 324 can be removed by washing or brushing with a suitable solvent or by lifting them off with a tacky roller.

Photo-curable prepolymers are well known in the art. In certain embodiments, the photo-curable prepolymer includes a monomer comprising one or more double bonds or functional groups, e.g. hydrides or hydroxyl groups, suitable for chain extension and crosslinking. In other embodiments, the photo-curable prepolymer comprises a partial polymer or oligomer that contains one or more double bonds or functional groups, e.g. hydrides or hydroxyls, suitable for cross-linking or chain extension.

Examples of monomers containing a double bond are alkyl or hydroxyalkyl acrylates or methacrylates, such as methyl, ethyl, butyl, 2-ethylhexyl and 2-hydroxyethyl acrylate, isobornyl acrylate, methyl methacrylate and ethyl methacrylate, silicone acrylates, acrylonitrile, acrylamide, methacrylamide, N-substituted (meth)acrylamides, vinyl esters such as vinyl acetate, vinyl ethers such as isobutyl vinyl ether, styrene, alkyl- and halostyrenes, N-vinylpyrrolidone, vinyl chloride and vinylidene chloride.

Examples of monomers containing two or more double bonds are the diacrylates of ethylene glycol, propylene glycol, neopentyl glycol, hexamethylene glycol and of bisphenol A, and 4,4'-bis(2-acryloyloxyethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate or tris(2-acryloylethyl) isocyanurate.

Examples of partial polymers include, but are not limited to, acrylicized epoxy resins, acrylicized polyesters, polyesters containing vinyl ether or epoxy groups, polyurethanes and polyethers, unsaturated polyester resins. In a preferred embodiment, the prepolymer is an acrylic.

Optionally, a photo-initiator can be used to initiate the polymerization and/or crosslinking reactions. The photo-initiator absorbs the photon energy and produces radicals, which initiates a cascade of radical polymerization, including chain-extension and cross-linking. Photo-initiators are well known in the art. Examples of suitable photo-initiators include, but are not limited to, oxime esters, phenyl ketones, onium salts, and phosphine oxides, see, e.g. U.S. Pat. Nos. 6,949,678, 6,929,896, and 6,803,392; N. Buhler & D. Bellus, "Photopolymers as a powerful tool in modern technology", Pure & Appl. Chem., Vol. 67, No. 1, pp. 25-31, 1995; J. Crivello in Advances in Polymer Science, Vol. 62, pp. 1-48 (1984). In a preferred embodiment, the photo-initiator is Ciba Irgacure™ 754. Typically, with the use of the photo-initiator, the prepolymer coating can cure within 5 minutes, more preferably within 30 seconds.

In other embodiments, thermal-patterning can be carried out using an insulating thermal mask (e.g., an aperture mask), which only exposes regions of a matrix material layer to be cured to a heat source. Alternatively, in a mask-less approach, laser direct-write technology can be used to directly "write" a heated pattern on the prepolymer coating layer. Thermally-curable matrix materials are known to one skilled in the art. For example, the matrix material can be an epoxy, a resin and a sol-gel composite material.

Both the photo-patterning method and thermal-patterning method are compatible with the "reel-to-reel" process described above. For example, a photo-patterning station 198 can be a part of the web coating system 146, as shown in FIG. 15A. The photo-patterning station 198 can be configured in a number of ways to allow for continuous exposure and curing of the prepolymer coating.

Figure 19A:
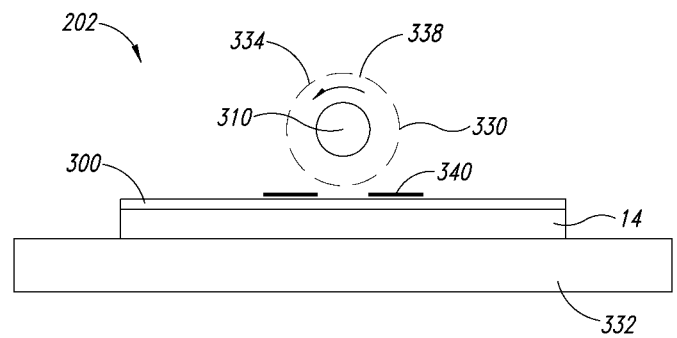
FIGS. 19A-19B show an example of a continuous photo-patterning method suitable for a web coating process.

In one embodiment, as shown in FIG. 19A, a rotating cylinder 330 is part of the photo-patterning station 198 (the web coating system 146 is not shown). The substrate 14, coated with a prepolymer coating 300, is moved along by a conveyor belt 332. The rotating cyclinder rotates at the same speed as the conveyor belt 332. The irradiation source 310 is positioned within the rotating cyclinder 330. An exterior 334 of the rotating cyclinder 330 is patterned, perforated or otherwise provided with openings 338 to allow the light to irradiate the prepolymer coating 300. Optionally, a guard slit or a collimator 340 for preventing any stray light can be positioned closely above the moving substrate.

Figure 19B:
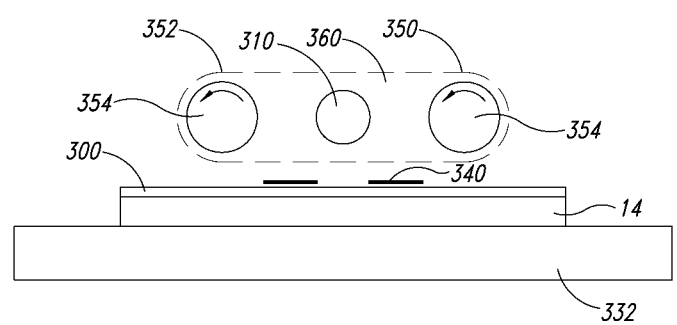

In a related configuration, as shown in FIG. 19B, a patterning belt 350 having a patterned or perforated exterior 352 can be used. The patterning belt 350 is driven by rollers 354, one of which is connected to a motor (not shown). The patterning belt 350 moves at the same speed as the moving conveyor belt 332, allowing continuous exposure of the prepolymer coating 300 to the irradiation source 310 through openings 360. Optionally, a guard slit 340 can be used.

Figure 20:
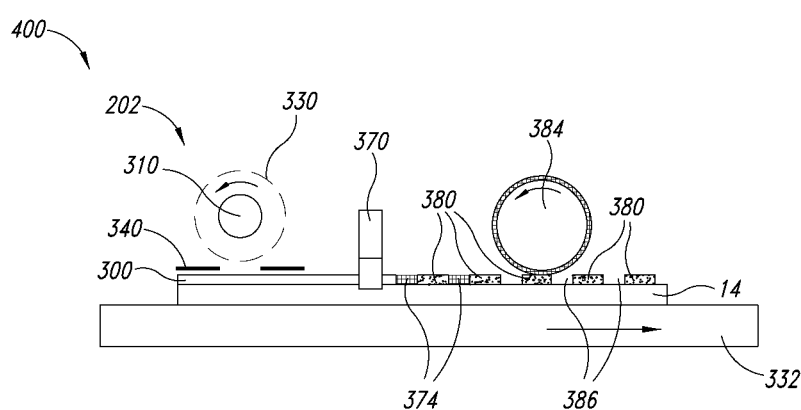
FIG. 20 shows a partial system and a process of fabricating a patterned transparent conductor.

FIG. 20 shows a partially integrated system 400 for forming a patterned conductive layer on a substrate. The system 400 can be fully integrated into the web coating system 146. In particular, the photo-patterning station 198 is identical to the one shown in FIG. 19A. Following the photo exposure and curing, the prepolymer coating 300 is cured at selective regions and will be further treated at a washing station 370 to remove any uncured prepolymer. The substrate 14, now comprising cured regions 380 and bare metal nanowires regions 374, moves to a rotating tacky roller 384. The tacky roller 384 contacts and removes the bare metal nanowires regions 374. Following the removal of the bare metal nanowires, the substrate is coated with conductive regions 380 among non-conductive regions 386.

The transparent conductors as described herein can be used as electrodes in a wide variety of devices, including any device that currently makes use of transparent conductors such as metal oxide films. Examples of suitable devices include flat panel displays, LCDs, touch screens, electomagnetic shieldings, functional glasses (e.g., for electrochromic windows), optoelectronic devices, and the like. In addition, the transparent conductors herein can be used in flexible devices, such as flexible displays and touch screens.

Figure 21:
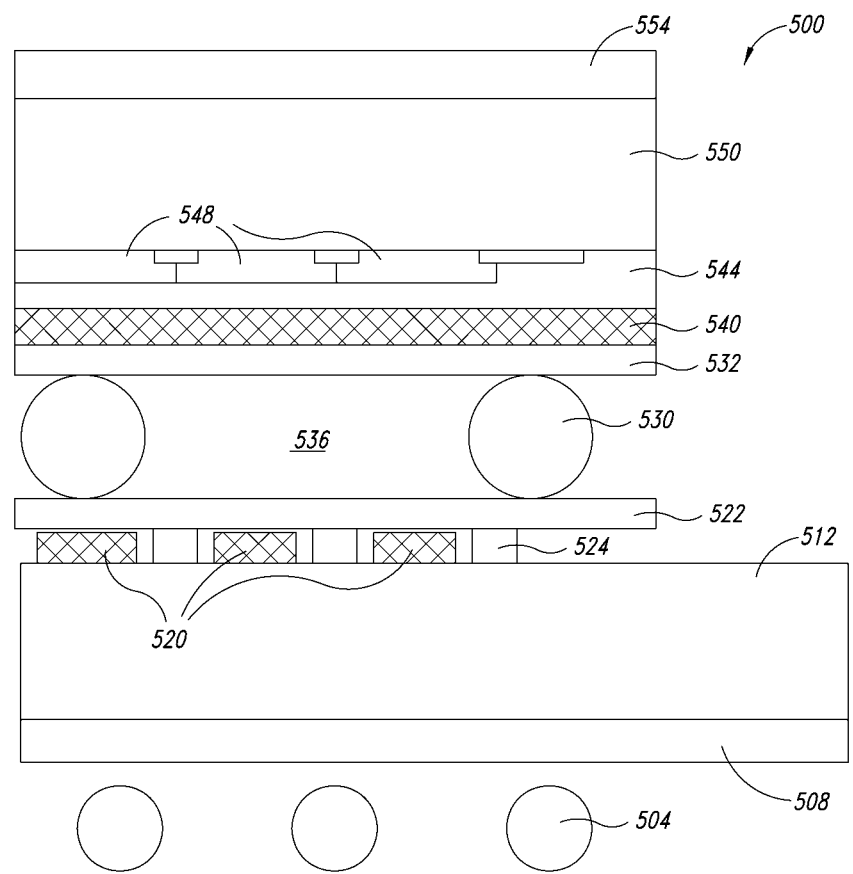
FIG. 21 shows a display device comprising transparent electrodes based on metal nanowires.

In one embodiment, the transparent conductors can be used as the pixel electrodes in a liquid crystal display (LCD) device. FIG. 21 shows schematically an LCD device 500. A backlight 504 projects light through a polarizer 508 and a bottom glass substrate 512. A plurality of first transparent conductor strips 520 are positioned between the bottom glass substrate 512 and a first alignment layer 522. Each transparent conductor strip 520 alternates with a data line 524. Spacers 530 are provided between the first alignment layer 522 and a second alignment layer 532, the alignment layers sandwiching liquid crystals 536 in between. A plurality of second transparent conductor strips 540 are positioned on the second alignment layer 532, the second transparent conductor strips 540 orienting at a right angle from the first transparent conductor strips 520. The second transparent conductor strips 540 are further coated with a passivation layer 544, colored matrices 548, a top glass substrate 550 and a polarizer 554. Advantageously, the transparent conductor strips 520 and 540 can be patterned and transferred in a laminating process onto the bottom glass substrate, and the alignment layer, respectively. Unlike the conventionally employed metal oxide strips (ITO), no costly deposition or etching processes are required.

In a further embodiment, the transparent conductor described herein forms part of a touch screen. A touch screen is an interactive input device integrated onto an electronic display, which allows a user to input instructions by touching the screen. The touch screen is optically clear to allow light and image to transmit through.

Figure 22:
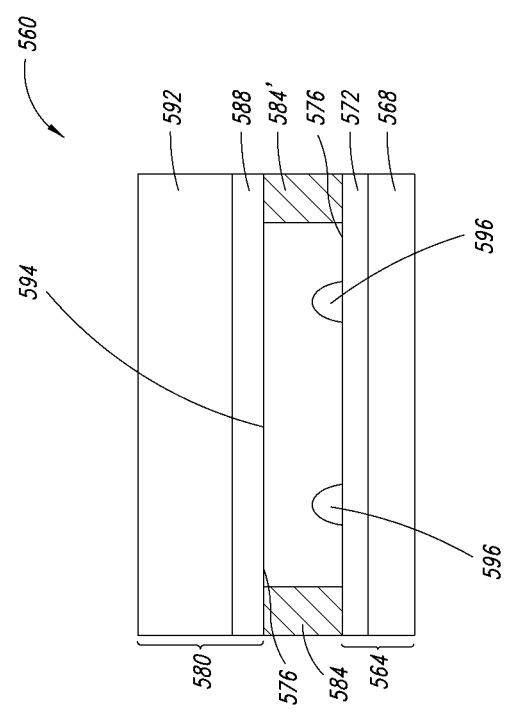
FIG. 22 shows a touch screen device comprising two transparent conductors based on metal nanowires.

FIG. 22 shows schematically a touch screen device 560 according to one embodiment. The device 560 includes a first transparent conductor 564 comprising a first substrate 568 coated or laminated with a first conductive layer 572, the first conductive layer 572 having a top conductive surface 576. A second transparent conductor 580 is positioned above the first transparent conductor 564 and separated therefrom by adhesive enclosures 584 and 584' at respective ends of the device 560. The second transparent conductor 580 includes a second conductive layer 588 coated or laminated on a second substrate 592. The second conductive layer 588 has an inner conductive surface 594 facing the top conductive surface 576 and is suspended over spacers 596.

When a user touches the second transparent conductor 580, the inner conductive surface 594 contacts the top conductive surface 576 of the first transparent conductor 564 and causes a change in the electrostatic field. A controller (not shown) senses the change and resolves the actual touch coordinate, which information is then passed to an operating system.

According to this embodiment, the inner conductive surface 594 and the top conductive surface 576 each has surface resistivity in the range of about 10-1000Ω/□, more preferably, about 10-500Ω/□. Optically, the first and second transparent conductors have high transmission (e.g., >85%) to allow for images to transmit through.

The first and second substrates can be a variety of materials, as described herein. For example, the first substrate can be rigid (e.g., glass, or rigid plastic such as polycarbonate or polyacrylate) while the second substrate can be a flexible film. Alternatively, for a flexible touch screen application, both substrates can be flexible films (e.g., plastic).

Currently available touch screens typically employ metal oxide conductive layers (e.g., ITO films). As note above, ITO films are fragile and costly to fabricate. In particular, ITO films are typically deposited on glass substrates at high temperature and in vacuo. In contrast, the transparent conductors described herein can be fabricated by high throughput methods and at low temperatures. They also allow for more diverse substrates, including flexible and durable substrates such as plastic films.

The transparent conductor structures, their electrical and optical properties, and the methods of fabrication are illustrated in more detail by the following non-limiting examples.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g. Y. Sun, B. Gates, B. Mayers, & Y. Xia, "Crystalline silver nanowires by soft solution processing", *Nanoletters*, (2002), 2(2) 165-168. A modified polyol method, described in U.S. Provisional Application No. 60/815,627 in the name of Cambrios Technologies Corporation, produces more uniform silver nanowires at higher yields than does the conventional "polyol" method. This application is incorporated by reference herein in its entirety.

Example 2

Preparation of a Transparent Conductor

An Autoflex EBG5 polyethylene terephthalate (PET) film 5 μm thick was used as a substrate. The PET substrate is an optically clear insulator. The light transmission and haze of the PET substrate are shown in Table 1. Unless specified otherwise, the light transmission was measured using the methodology in ASTM D1003.

An aqueous dispersion of silver nanowires was first prepared. The silver nanowires were about 70 nm to 80 nm in width and around 8 μm in length. The concentration of the silver nanowires (AgNW) was about 0.5% w/v of the dispersion, resulting in an optical density of about 0.5 (measured on a Molecular Devices Spectra Max M2 plate reader). The dispersion was then coated on the PET substrate by allowing the nanowires to sediment onto the substrate. As understood by one skilled in the art, other coating techniques can be employed e.g., flow metered by a narrow channel, die flow, flow on an incline and the like. It is further understood that the viscosity and shear behavior of the fluid as well as the interactions between the nanowires may affect the distribution and interconnectivity of the nanowires coated.

Thereafter, the coated layer of silver nanowires was allowed to dry by water evaporation. A bare silver nanowire film, also referred to as a "network layer", was formed on the PET substrate. (AgNW/PET) The light transmission and haze were measured using a BYK Gardner Haze-gard Plus. The surface resistivity was measured using a Fluke 175 True RMS Multimeter. The results are shown in Table 1. The interconnectivity of the nanowires and an areal coverage of the substrate can also be observed under an optical or scanning electron microscope.

The matrix material was prepared by mixing polyurethane (PU) (Minwax Fast-Drying Polyurethane) in methyl ethyl ketone (MEK) to form a 1:4 (v/v) viscous solution. The matrix material was coated on the bare silver nanowire film spin-coating. Other known methods in the art, for example, doctor blade, Meyer rod, draw-down or curtain coating, can be used. The matrix material was cured for about 3 hours at room temperature, during which the solvent MEK evaporated and the matrix material hardened. Alternatively, the curing can take place in an oven, e.g., at a temperature of 50° C. for about 2 hours.

A transparent conductor having a conductive layer on the PET substrate (AgNW/PU/PET) was thus formed. The conductive layer of the silver nanowires in the matrix was about 100 nm thick. Its optical and electrical properties were measured and the results are shown in Table 1.

The transparent conductor was further subjected to a tape test. More specifically, a 3M Scotch® 600 adhesive tape was firmly applied to the surface of the matrix and then removed. Any loose silver nanowires were removed along with the tape. After the tape test, the optical and electrical properties of the transparent conductor were measured and the results are shown in Table 1.

By way of comparison, a matrix-only film was formed on a PET substrate (PU/PET) under the same conditions as described above. The optical properties (light transmission and haze) and the electrical properties of the PU/PET are also provided in Table 1.

As shown in Table 1, the matrix-only film on PET (PU/PET) had a slightly higher light transmission as well as haze value than a PET substrate. Neither was conductive. By comparison, the bare silver nanowire film on PET was highly conductive, registering a surface resistivity of 60Ω/□. The deposition of the bare silver nanowire film on the PET lowered the light transmission and increased the haze. However, the bare silver nanowire film on PET was still considered optically clear with a light transmission of more than 80%. The optical and electrical properties of the bare silver nanowire film on PET were comparable or superior to metal oxide films (e.g., ITO) formed on PET substrates, which typically range from 60 to 400 Ω/□.

As further shown in Table 1, the transparent conductor based on silver nanowires in the polyurethane matrix had an almost identical light transmission as the bare silver nanowire film on PET, and a slightly higher haze. The resistivity of the transparent conductor remained the same as the bare silver nanowire film, indicating that the coating of the matrix material did not disturb the silver nanowire film.

The transparent conductor thus formed was optically clear, and had a comparable or superior surface resistivity to metal oxide films (e.g., ITO) formed on PET substrates.

In addition, the tape test did not alter the resistivity or the light transmission of the transparent conductor, and only slightly increased the haze.

TABLE 1

| Transparent Media | Light Transmission (%) | Haze (%) | Resistivity (Ω/□) |
|---|---|---|---|
| PET | 91.6 | 0.78 | non-conductive |
| PU/PET | 92.3 | 0.88 | non-conductive |
| AgNW/PET | 87.4 | 4.76 | 60 |
| AgNW/PU/PET | 87.2 | 5.74 | 60 |
| After tape test | 87.2 | 5.94 | 60 |

Example 3

Accelerated $H_2S$ Corrosion Tests

Sulfides, such as hydrogen sulfide ($H_2S$), are known corrosive agents. The electrical properties of the metal nanowires (e.g., silver) can potentially be affected in the presence of the atmospheric sulfides. Advantageously, the matrix of the transparent conductor serves as a gas permeation barrier. This prevents, to certain degree, the atmospheric $H_2S$ from contacting the metal nanowires embedded in the matrix. Long-term stability of the metal nanowires can be further obtained by incorporating one or more corrosion inhibitors in the matrix, as described herein.

In the United States, the amount of $H_2S$ in the air is about 0.11-0.33 parts per billion (ppb). At this level, corrosion is expected to take place over an extended period of time. Thus, an accelerated $H_2S$ corrosion test was designed to provide an extreme case of $H_2S$ corrosion.

Figure 23:
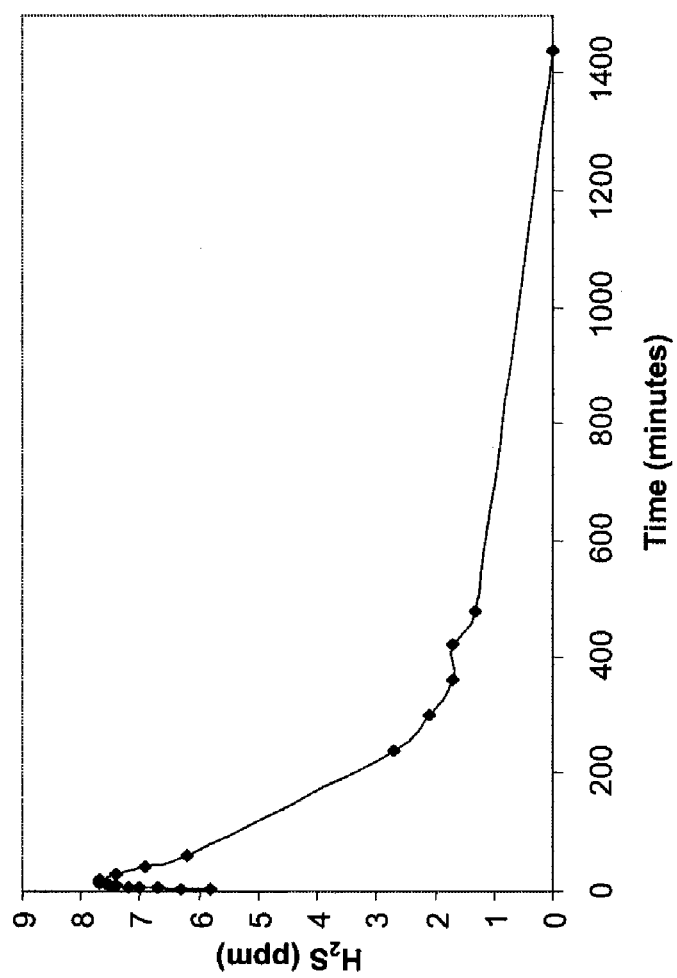
FIG. 23 shows a typical release profile of $H_2S$ gas from freshly cooked egg yolks.

Freshly cooked egg yolks were broken into pieces and sealed in a plastic bag. A $H_2S$ meter (Industrial Scientific, GasBadge Plus—Hydrogen Sulfide Single Gas Monitor) was inserted into the bag to monitor the release of $H_2S$ from the egg yolks. FIG. 23 shows a typical release profile of the $H_2S$ gas over a period of 24 hours. After an initial build-up of the $H_2S$ in the bag, the gas level dropped, indicating that the gas had diffused out of the permeable bag. Nevertheless, the levels of the $H_2S$ gas (peaked at 7.6 ppm) in the bag greatly surpassed the level of the atmospheric $H_2S$ gas.

A bare silver nanowire film on PET was prepared according to Example 2. The film was placed in a plastic bag with freshly cooked egg yolks. The film began to darken within two hours, indicating that the silver had been tarnished and black $Ag_2S$ was formed. In contrast, color changes in films of silver nanowires in polyurethane matrix were not observed until after 2-3 days, indicating that the polyurethane matrix acted as a barrier to slow down the permeation of the $H_2S$ gas.

Example 4

Incorporation of Corrosion Inhibitors

The following samples of conductive films were prepared. A PET substrate was used for each sample. In certain samples, corrosion inhibitors, including benzotriazole, dithiothiadiazole and acrolein, were incorporated during the preparation of the conductive films.

Samples 1-2 were prepared according to the method described herein. No corrosion inhibitor was present.

Sample 1 was a conductive film of bare silver nanowires.

Sample 2 was a conductive film of silver nanowires in a polyurethane matrix.

Samples 3-6 were prepared by first forming a bare silver nanowire film on a PET substrate (i.e., Sample 1). Thereafter, various corrosion inhibitors were incorporated during the coating processes of the matrix material.

Sample 3 was prepared by coating a 0.1 w/v % solution of benzotriazole (BTA) in methyl ethyl ketone (MEK) on the bare silver nanowire film, allowing the solvent to dry after coating, followed by coating the matrix material of polyurethane (PU) in MEK (1:4).

Sample 4 was prepared by first incorporating 1.5 v/v % of dithiothiadiazole in a matrix material PU/MEK (1:4), followed by coating the matrix material on the bare silver nanowire film.

Sample 5 was prepared by first dipping a bare silver nanowire film in a solution of 1.5 v/v % of dithiothiadiazole in MEK, allowing the solvent to dry after dipping, followed by coating with a matrix material PU/MEK (1:4) having 1.5 v/v % of dithiothiadiazole.

Sample 6 was prepared by first incorporating 1.5 v/v % of acrolein in a matrix material PU/MEK (1:4), followed by coating the matrix material on a bare silver nanowire film.

The optical and electrical properties of the Samples 1-6 were measured before and after an accelerated $H_2S$ treatment, as described in Example 3. The results are shown in FIGS. 24A, 24B and 24C.

Figure 24A:
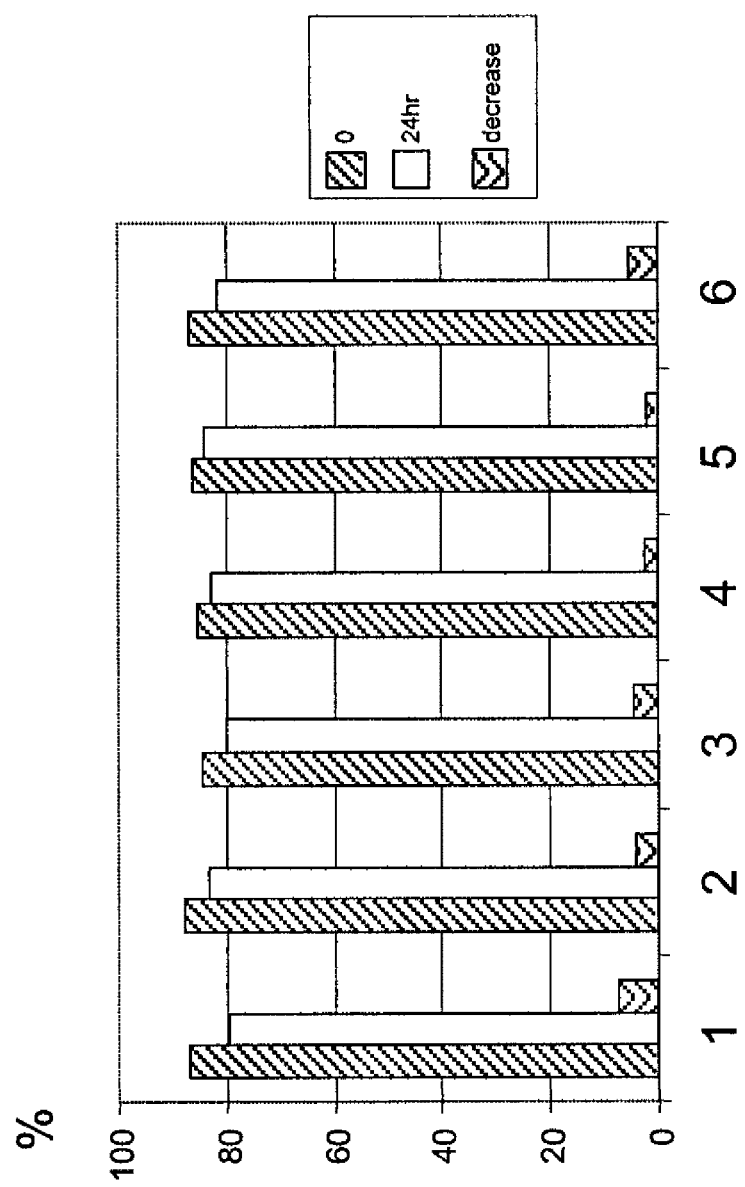
FIG. 24A shows the light transmissions of six samples of conductive films before and after an accelerated $H_2S$ corrosion test.

FIG. 24A shows the light transmission measurements of Samples 1-6 before the $H_2S$ treatment and 24 hours after the $H_2S$ treatment. For purpose of comparison, the decrease of light transmission for each sample is also graphed. Prior to the $H_2S$ treatment, all of the samples were shown to be optically clear (having a light transmission higher than 80%). Following 24 hours of the $H_2S$ treatment, all of the samples have experienced decreases in their light transmissions due to different degrees of silver tarnish.

As expected, Sample 1 had the most reduction in light transmission. Samples 3 and 6 did not perform better than the matrix-only sample (Sample 2). Samples 4 and 5, however, had less reduction in light transmission compared to the matrix-only sample, indicating the corrosion inhibitor dithiothiadiazole was effective in protecting the silver nanowires from being corroded.

Figure 24B:
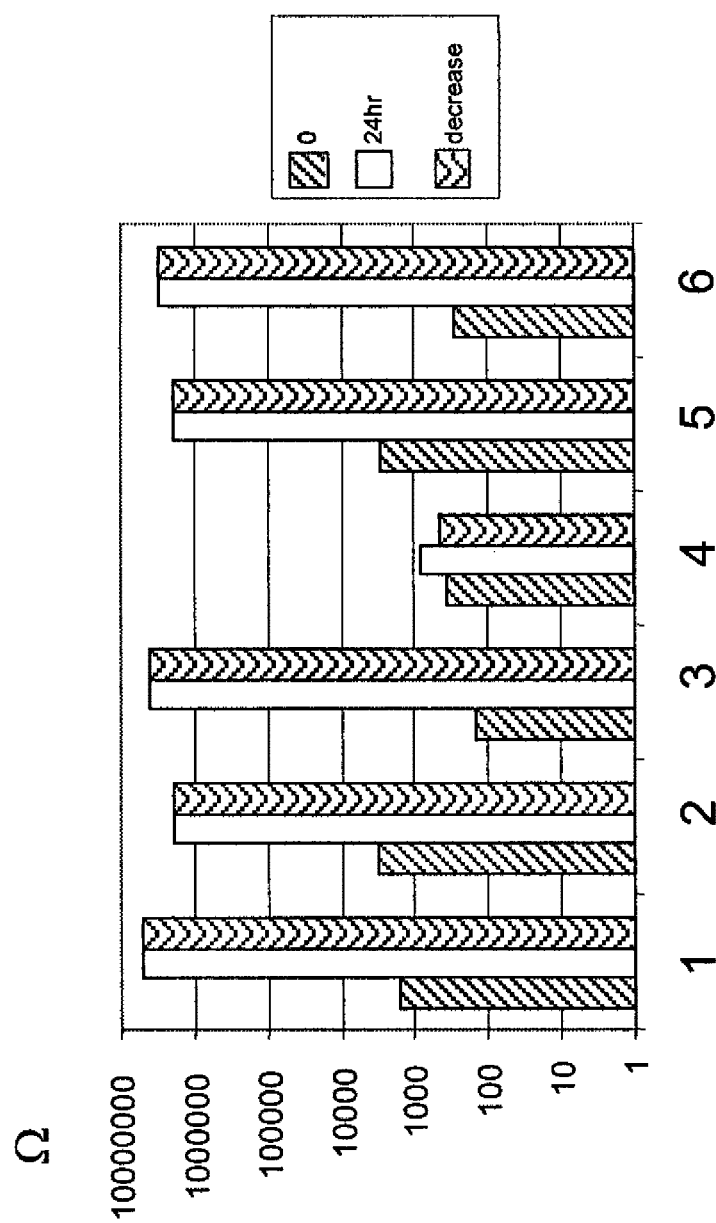
FIG. 24B shows the resistances of six samples of conductive films before and after an accelerated $H_2S$ corrosion test.
Figure 24C:
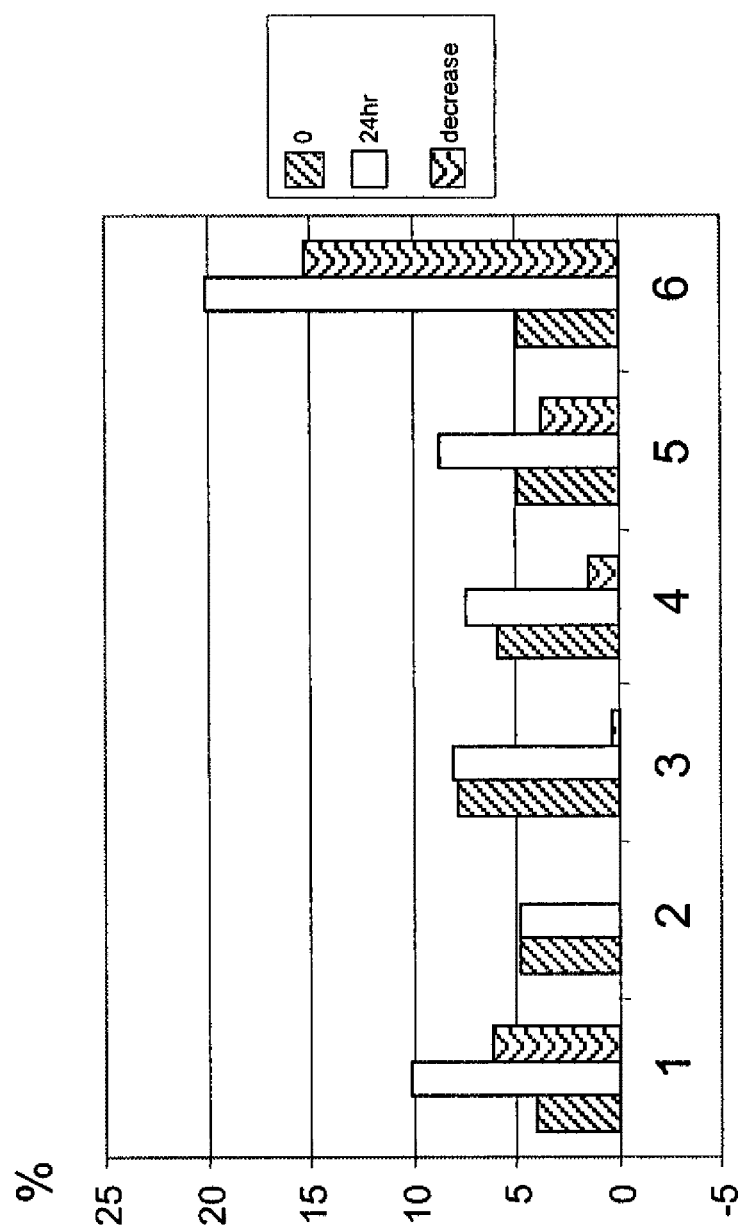
FIG. 24C shows the hazes of six samples of conductive films before and after an accelerated $H_2S$ corrosion test.

FIG. 24B shows the resistance measurements of Samples 1-6 before the $H_2S$ treatment and 24 hours after the $H_2S$ treatment. For purpose of comparison, the decrease of the resistance for each sample is also graphed. As shown, all but Sample 4 experienced dramatic increases in their resistances and effectively became non-conductive, although the onset of the degradation in electrical properties was significantly delayed for some samples. Sample 4 had only a modest increase in its resistance. It is noted that the impacts of $H_2S$ on Sample 4 and Sample 5 differed considerably, despite that both Samples had the same corrosion inhibitor (dithiothiadiazole). This implies that the coating processes may affect the effectiveness of a given corrosion inhibitor.

FIG. 24C shows the haze measurements of Samples 1-6 before the $H_2S$ treatment and 24 hours after the $H_2S$ treatment. For purpose of comparison, the change in the haze for each sample is also graphed. All the samples showed increases in their haze measurements. With the exception of Samples 1 and 6, the haze was within acceptable range (less than 10%) for each of Samples 2-5.

Sample 4 was shown to have the best overall performance in withstanding the corrosive $H_2S$ gas. By incorporating the corrosion inhibitor (dithiothiadiazole) in the matrix, the transparent conductor showed clear advantage over Sample 2 in which no corrosion inhibitor was present.

It is noted that the $H_2S$ levels in these accelerated tests were far greater than the atmospheric $H_2S$. It is therefore expected that transparent conductors prepared similarly as Sample 4 would fare even better in the presence of the atmospheric $H_2S$.

Example 5

Pressure-Treatment of Metal Nanowire Network Layers

Table 2 illustrates the results of two trials of applying pressure to a surface of a silver nanowire network layer (or "network layer") on a substrate.

Specifically, silver nanowires of around 70 nm to 80 nm in width and around 8 μm in length were deposited on an Autoflex EBG5 PET substrate. The substrate was treated with Argon plasma prior to the deposition of the nanowires. A network layer was formed according to the method described in Example 2. No matrix material was applied to the networks prior to the pressure treatment. The Trials listed in Table 2 were carried out using a single stainless steel roller on a rigid bench-top surface. The area of the network layer treated was from 3 to 4 inches wide and from 3 to 4 inches long.

TABLE 2

| Process | Trial 1 R (Ω/square) | Trial 2 R (Ω/square) | Transmission (%) | Haze (%) |
|---|---|---|---|---|
| (original) | 16000 | 400000 | 88.2 | 3.34 |
| 1 roll @ 340 psi | 297 | 690 | 87.3 | 3.67 |
| 1 roll @ 340 psi | 108 | 230 | 87.2 | 4.13 |
| 1 roll @ 340 psi | 73 | 127 | 86.6 | 4.19 |
| 1 roll @ 340 psi | 61 | 92 | 87.1 | 4.47 |
| 1 roll @ 340 psi | 53 | 86 | 86.6 | 4.44 |
| Ar plasma | 38 | 62 | 88.0 | 4.19 |

Prior to any application of pressure, the network layers had the resistance indicated in the "original" row (the network layers were not pre-treated with plasma.) Each row of Table 2 indicates a subsequent single roll across the network layer at approximately 340 psi.

In each trial, the network layer was rolled 5 times. Thereafter, a plasma treatment was applied to the network layer. The resistance after each roll is as listed in the second (first trial) and third (second trial) columns. Variation in transmission and haze for the second trial is as listed in the fourth and fifth columns, respectively. As shown, it was determined that the conductivity of the network layer of each trial was increased by application of pressure to a surface thereof.

As shown above in Table 2, application of pressure to a network layer by a roller can reduce the light transmission of the layer and increase the haze. As shown in Table 3 below, a washing process following the pressure treatment can further improve the transmission and reduce the haze of the network layer.

TABLE 3

| Process | Resistance (Ω/□) | Transmission (%) | Haze (%) |
|---|---|---|---|
| (original) | 700,000 | 86.4 | 4.77 |
| 2 rolls @ 340 psi | 109 | 85.6 | 5.24 |
| soap & water wash | 44 | 86.0 | 4.94 |
| Ar plasma | 24 | 85.9 | 4.81 |

As shown in Table 3, application of pressure to a network layer by twice rolling with a single stainless steel bar at approximately 340 psi on a rigid surface reduced the light transmission and increased the haze of the network layer. Washing the network layer with soap and water after the rolling, however, increased the transmission and decreased the haze. An argon plasma treatment further improved the transmission and haze.

Washing the network with soap and water without rolling is also effective at improving the conductivity to some extent.

Following the pressure or washing treatments, a matrix material can be coated as previously described in Example 2.

Example 6

Photo-Patterning of Conductive Layers

Figure 25A:
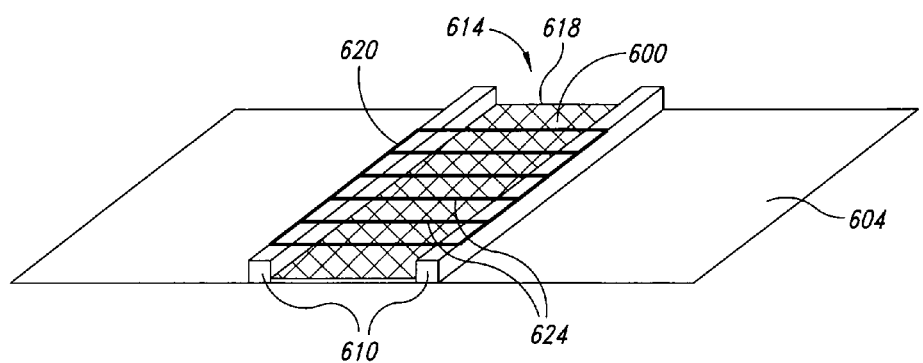
FIG. 25A shows an example of directly patterning a nanowire-based transparent conductive film.

FIG. 25A illustrates one method of directly patterning a nanowire-based transparent conductive film. In this example, a silver nanowire network layer ("network layer") 600 was initially formed on a glass substrate 604 according to the method described in Example 2. Two holders 610 were placed on the glass substrate 604 to define an area 614 for matrix formation. A photo-curable matrix material 618 comprising a mixture of prepolymers was coated over the network layer 600 within the area 614. A mask 620 was placed upon the holders 610. The mask 620 was a glass slide having a number of dark lines 624 of about 500 μm wide. The matrix material was then irradiated under a Dymax 5000 lamp for 90 seconds. The matrix material cured in the regions exposed to light and remained liquid in the regions that were masked by the dark lines.

Figure 25B:
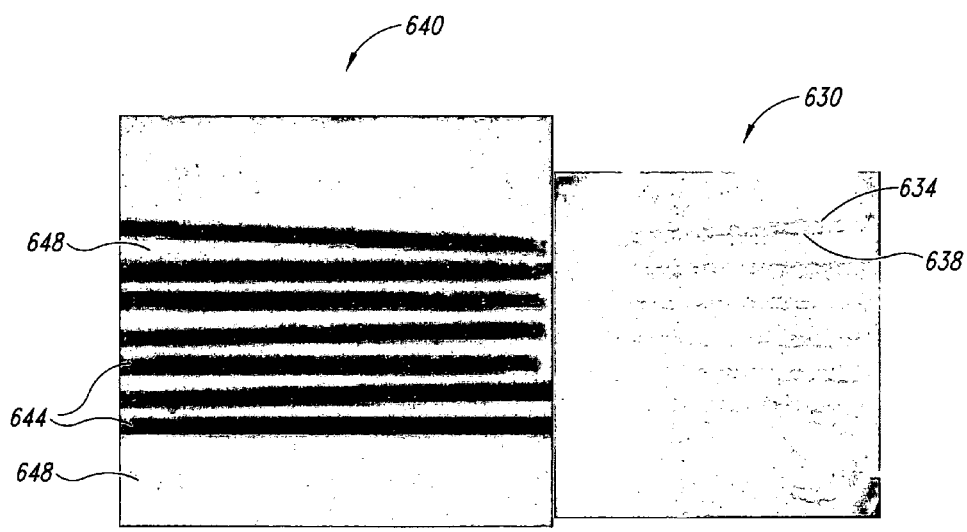
FIG. 25B shows photographs of the patterned conductive films before and after an adhesive tape treatment.

As shown in FIG. 25B, conductive film 630 was obtained after the photo-patterning described above. The lighter regions 634 were exposed to UV irradiation and the dark regions 638 were masked from the light exposure. Conductive film 640 was further subjected to an adhesive tape or a tacky roll to remove the matrix material and the nanowires in uncured regions 644. As shown, the contrast between the uncured regions 644 and the cured regions 644 was pronounced. Following the adhesive tape treatment, the concentration of the nanowires dropped below the percolation threshold in the uncured regions 644. Electrical measurements using fine probe tips showed that the uncured regions 644 were non-conductive.

FIGS. 26A-F show a photo-patterned conductive layer at higher magnifications. FIG. 26A shows the conductive film 640 immediately after photo-curing (5×). FIG. 26B shows the conductive film 640 after the adhesive tape treatment (5×), in which the cured region 648 appears much lighter than the uncured region 644. At higher magnification (FIGS. 26C and 26D, 20×), it can be observed that the uncured region 644 has a lower concentration of nanowires than the cured region 648. This contrast is more apparent in FIGS. 26E and 26F (100×).

Figure 27C:
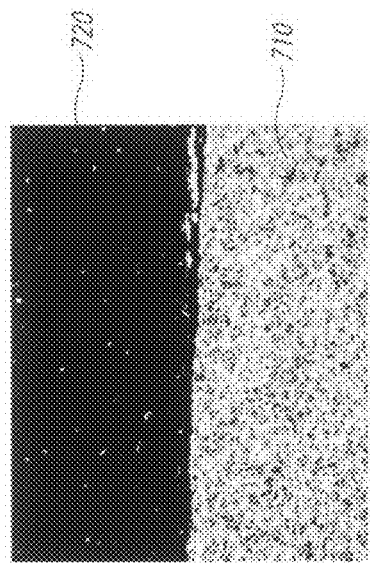
FIGS. 27A-27D show photographs of another exemplary conductive film before and after a solvent treatment.
Figure 27D:
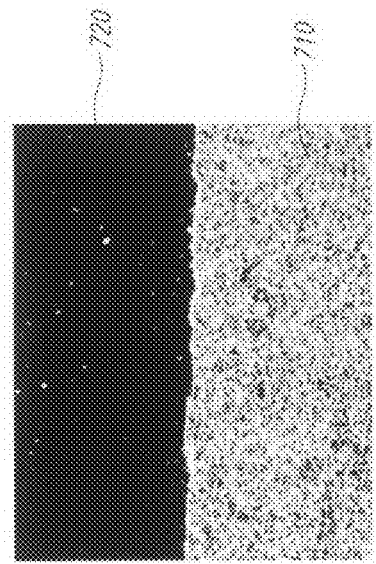
Figure 27A:
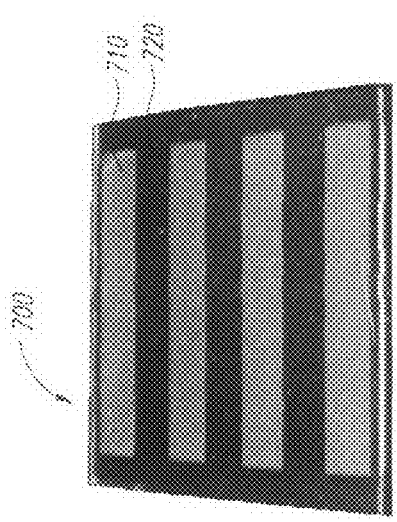
Figure 27B:
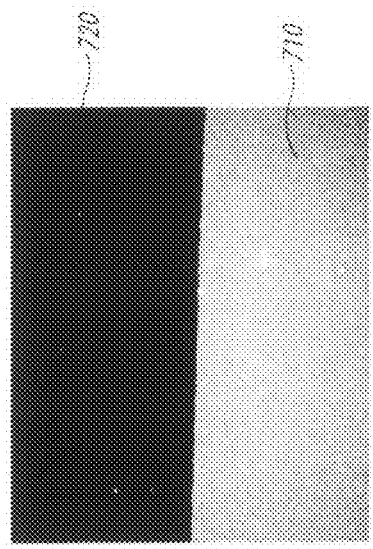

As an alternative to removing the matrix material and nanowires in the uncured region using adhesive tapes or tacky rolls, a solvent may be used to wash the uncured regions. As shown in FIGS. 27A-D, a conductive film 700 was prepared as described above and exposed to UV irradiation through a brass aperture mask. FIG. 27A shows cured regions (conductive regions) 710 and uncured regions 720 after being washed with ethanol and wiped. FIGS. 27B-D illustrate, at increasing magnifications, the contrast of the nanowire concentration in the uncured regions 720 compared to that in the cured regions 710. In the uncured regions 720, most of the uncured matrix material and the silver nanowires had been removed by the ethanol washing. Photo-patterning therefore produces conductive regions and non-conductive region according to a predetermined pattern.

Example 7

Photo-Curable Formulations

The matrix material described in Example 6 can be formulated by combining an acrylate monomer (or prepolymer, as defined herein), a multi-functional acrylate monomer (or prepolymer) and at least one photoinitiator. Any acrylate monomers or prepolymers can be used, such as epoxy acrylates, more specifically, 2-ethylhexyl acrylate, 2-phenoxyethyl acrylate, lauryl acrylate, methacrylates, and the like. Any multi-functional acrylate monomer (or prepolymer) can be used to promote the formation of a crosslinking polymer network. Examples include trimethylolpropane triacrylate (TMPTA), tripropylene glycol diacrylate, bisphenol-A diacrylate, propoxylated (3) trimethylolpropane triacrylate, dipentaerythritol penta-acrylate. Any photoinitiator, for example, ketone based initiators, can be used. Specific examples include: Ciba Irgacure 754, phenyl ketone such as Ciba Irgacure 184, α-hydroxy ketones, glyoxylates, benzophenone, α-amino ketones and the like. More specifically, a fast-curing formulation can be prepared by combining 60%-70% 2-ethylhexyl acrylate, 15%-30% trimethylolpropane triacrylate and about 5% Ciba Irgacure 754.

Other additives can be added to enhance the stability and/or promote the adhesion of the matrix and the nanowires. For example, an adhesion promoter (e.g., silanes) that promotes the coupling between organic matter and inorganic matter can be used. Examples of the silane-type adhesion promoters include GE Silquest A174, GE Silquest A1100 and the like. Antioxidants such as Ciba Irgonox 1010ff, Ciba Irgonox 245, Irgonox 1035 can be used. Moreover, additional or co-initiators can be used to promote the efficiency of the photoinitiator. Examples of coinitiator can include any types of tertiary amine acrylates, such as Sartomer CN373, CN 371, CN384, CN386 and the like. An additional photoinitiator such as Ciba Irgacure OXE01 can be further added.

Below are four exemplary photo-curable formulations suitable as the matrix material used in this example:

| Formulation 1 |
| --- |
| 75% 2-ethylhexyl acrylate; |
| 20% trimethylolpropane triacrylate (TMPTA); |
| 1% adhesion promoter (GE Silquest A1100); |
| 0.1% antioxidant (Ciba Irgonox 1010ff) and |
| 4% photoinitiator (Ciba Irgacure 754) |

| Formulation 2 |
| --- |
| 73.9% 2-ethylhexyl acrylate; |
| 20% trimethylolpropane triacrylate (TMPTA); |
| 1% adhesion promoter (GE Silquest A1100); |
| 0.05% antioxidant (Ciba Irgonox 1010ff) and |
| 5% photoinitiator (Ciba Irgacure 754) |

| Formulation 3 |
| --- |
| 73.1% tripropylene glycol diacrylate (TPGDA) |
| 22.0% trimethylolpropane triacrylate (TMPTA) |
| 4.9% photoinitiator (Ciba Irgacure 754) |
| 0.03% antioxidant (4-methoxyphenol) |

| Formulation 4 |
| --- |
| 68% 2-ethylhexyl acrylate; |
| 20% trimethylolpropane triacrylate (TMPTA); |
| 1% adhesion promoter (GE Silquest A1100); |
| 0.1% antioxydant (Ciba Irgonox 1010ff) and |
| 5% photoinitiator I (Ciba Irgacure 754) |
| 5% coinitiator (Sartomer CN373) |
| 1% photoinitiator II (Ciba Irgacure OXE01) |

Example 8

Nanowire Dispersion

A nanowire dispersion, or ink, was formulated by combining about 0.08% wt. HPMC, about 0.36% wt. silver nanowires, about 0.005% wt. Zonyl® FSO-100 and about 99.555% wt. water. As an initial step, an HPMC stock solution was prepared. An amount of water equal to about ⅜ of the total desired volume of nanowire dispersion was placed in a beaker and heated to between 80° C. and 85° C. on a hotplate. Enough HPMC to make 0.5% wt. HPMC solution was added to the water and the hotplate was turned off. The HPMC and water mixture was stirred to disperse the HPMC. The remainder of the total amount of water was chilled on ice and then added to the heated HPMC solution and stirred at high RPM for about 20 min. The HPMC solution was filtered through a 40 μm/70 μm (absolute/nominal) Cuno Betapure filter to remove undisolved gels and particulates. Next a stock solution of Zonyl® FSO-100 was prepared. More specifically, 10 g of Zonyl® FSO 100 were added to 92.61 mL of water and heated until the Zonyl® FSO 100 was fully dissolved. The necessary amount of HPMC stock solution to make about 0.08% wt. HPMC solution in the final ink composition was placed in a container. Then, the necessary amount of Di water to make about 99.555% wt. water solution in the final ink composition was added. The solution was stirred for about 15 min. and the necessary amount of silver nanowires to make about 0.36% Ag nanowire solution in the final ink composition were added. Finally, the necessary amount of the Zonyl® FSO-100 stock solution to make about 0.005% wt. Zonyl® FSO-100 solution was added.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of fabricating a transparent conductor comprising:
depositing a coating composition on a surface of a substrate, the coating composition comprising: a liquid and a plurality of conductive nanostructures consisting of silver nanowires, wherein the silver nanowires are 0.05% to 1.4% of a total weight of the coating composition;

forming a silver nanowire network layer on the substrate by allowing the liquid to dry, wherein the silver nanowires intersect to provide the silver nanowire network layer;

providing a corrosion inhibitor;

forming a matrix material layer on the silver nanowire network layer, wherein the matrix material layer is conductive; and defining a pattern with a first region and a second region, wherein the silver nanowire network layer is located in the first region to form a conductive region, the matrix material layer in the second region is totally removed and the silver nanowires in the second region are partially removed to reduce a concentration of the silver nanowires in the second region to a level below a percolation threshold so that the second region defines a non-conductive region.

2. The method of claim 1 wherein the coating composition further comprises an additive selected from carboxy methyl cellulose, 2-hydroxy ethyl cellulose, hydroxy propyl methyl cellulose, methyl cellulose, poly vinyl alcohol, tripropylene gylcol, and xanthan gum.

3. The method of claim 1 further comprising pre-treating the surface of the substrate prior to depositing the coating composition.

4. The method of claim 3 wherein pre-treating the surface of the substrate creates a pattern comprising at least one pre-treated region and at least one untreated region.

5. The method of claim 4 wherein the silver nanowire network layer is only formed on the pre-treated region.

6. The method of claim 3 wherein pre-treating the surface of the substrate comprises depositing an intermediate layer on the surface of the substrate, performing a plasma treatment to the surface of the substrate, performing an UV-ozone treatment to the surface of the substrate, or performing a corona discharge treatment to the surface of the substrate.

7. The method of claim 1 further comprising applying pressure, heat or a combination thereof to the silver nanowire network layer.

8. The method of claim 1 wherein forming the matrix material layer on the silver nanowire network layer comprises:

depositing a matrix material on the silver nanowire network layer; and curing the matrix material to form the matrix material layer, wherein the silver nanowires are dispersed or embedded in the matrix material layer to form a conductive layer.

9. The method of claim 8 further comprising:

causing at least a section of each of the silver nanowires to protrude above a surface of the matrix material layer to provide a conducting surface of the conductive layer.

10. The method of claim 8 wherein the matrix material comprises a polymer dispersed in a solvent or a prepolymer.

11. The method of claim 10 wherein the prepolymer is photo-curable.

12. The method of claim 8 wherein the matrix material layer is formed into a patterned matrix material layer.

13. The method of claim 8 wherein the substrate is flexible.

14. The method of claim 13 wherein curing the matrix material comprises continuously exposing the matrix material to light irradiation, and the light irradiation is projected to the matrix material according to a pattern.

15. The method of claim 8 wherein the substrate is a flexible donor substrate.

16. The method of claim 15 wherein the flexible donor substrate is coated with a release layer.

17. The method of claim 15 further comprising detaching the conductive layer from the flexible donor substrate and applying the conductive layer to a substrate of choice.

18. The method of claim 1 wherein each of the silver nanowires has an aspect ratio of about 50 or more.

19. The method of claim 1 wherein each of the silver nanowires has an aspect ratio of about 100 or more.

20. The method of claim 1 wherein the liquid is water, an alcohol, a ketone, an ether, a hydrocarbon or an aromatic solvent.

21. The method of claim 1 wherein the coating composition further comprises one or more surfactants.

22. The method of claim 21 wherein the one or more surfactants are fluorinated alkyl ester, polyoxyethylene octyl phenyl ether, 2,5,8,11-tetraethyl-6-dodecyn-5,8-diol ethoxylate, or n-Dodecyl-β-D-maltoside.

23. The method of claim 1 wherein a portion of the silver nanowire network layer extending through the matrix material layer has a threshold surface loading level of about 0.05 $\mu g/cm^2$ to about 10 $\mu g/cm^2$.

24. The method of claim 23 wherein the threshold surface loading level is about 0.1 $\mu g/cm^2$ to about 5 $\mu g/cm^2$.

25. The method of claim 24 wherein the threshold surface loading level is about 0.8 $\mu g/cm^2$ to about 3 $\mu g/cm^2$.

26. The method of claim 1 wherein the matrix material layer comprises a conductive polymer.

27. The method of claim 26 wherein the conductive polymer comprises poly(3,4-ethylenedioxythiophene), polyanilines, polythiophenes, or polydiacetylenes.

28. The method of claim 1 wherein the silver nanowires are embedded in a portion of the matrix material layer.

29. The method of claim 1 wherein the silver nanowires are alloyed or plated with another metal.

30. The method of claim 29 wherein the silver nanowires are plated with gold.

31. The method of claim 1 wherein the corrosion inhibitor binds to the silver nanowires to form a protective film on the silver nanowire network layer.

32. The method of claim 1 wherein the silver nanowire network layer further comprises a plurality of reservoirs each containing the corrosion inhibitor.

33. The method of claim 1 wherein the liquid comprises solvents that are 94.5% to 99.0% of the total weight of the coating composition; and wherein the coating composition further comprises:

a surfactant that is 0.0025% to 0.1% of the total weight of the coating composition; and a viscosity modifier that is 0.02% to 4% of the total weight of the coating composition.

34. The method of claim 1 wherein providing the corrosion inhibitor comprises dipping the silver nanowire network layer in a solution of the corrosion inhibitor.

35. The method of claim 1 wherein providing the corrosion inhibitor comprises coating a layer of the corrosion inhibitor on the silver nanowire network layer.

36. The method of claim 1 wherein providing the corrosion inhibitor comprises incorporating the corrosion inhibitor in the matrix material layer.

37. The method of claim 1 wherein forming the matrix material layer on the silver nanowire network layer comprises:

coating a prepolymer on the silver nanowire network layer;
curing the prepolymer in the first region; and
totally removing the prepolymer in the second region.

38. The method of claim 1 further comprising:
exposing the silver nanowire network layer in a reducing agent.

39. The method of claim 38 wherein the reducing agent comprises borohydrides, boron nitrogen compounds, or hydrogen gas.

* * * * *